United States Patent
Kneissl et al.

(10) Patent No.: US 7,031,365 B2
(45) Date of Patent: Apr. 18, 2006

(54) LOCALLY-OUTCOUPLED CAVITY RESONATOR HAVING UNIDIRECTIONAL EMISSION

(75) Inventors: Michael A. Kneissl, Mountain View, CA (US); Noble M. Johnson, Menlo Park, CA (US); David K. Biegelsen, Portola Valley, CA (US); Richard K. Chang, Hamden, CT (US); A. Douglas Stone, New Haven, CT (US); Grace D. Chern, New Haven, CT (US); Hakan E. Tureci, New Haven, CT (US); Joseph Zyss, Sceaux (FR)

(73) Assignee: Xerox Corporation, Stamford, CT (US)

( * ) Notice: Subject to any disclaimer, the term of this patent is extended or adjusted under 35 U.S.C. 154(b) by 271 days.

(21) Appl. No.: 10/428,068

(22) Filed: May 2, 2003

(65) Prior Publication Data

US 2004/0218654 A1 Nov. 4, 2004

Related U.S. Application Data

(60) Provisional application No. 60/430,000, filed on Nov. 27, 2002.

(51) Int. Cl.
 *H01S 3/083* (2006.01)

(52) U.S. Cl. .......................................... 372/94; 372/67

(58) Field of Classification Search ................ 372/94, 372/67; 333/227; 356/459
See application file for complete search history.

(56) References Cited

U.S. PATENT DOCUMENTS

| | | | | |
|---|---|---|---|---|
| 5,398,256 A | * | 3/1995 | Hohimer et al. | 372/94 |
| 6,144,791 A | * | 11/2000 | Wach et al. | 385/123 |
| 6,556,610 B1 | * | 4/2003 | Jiang et al. | 372/75 |
| 2003/0108080 A1 | * | 6/2003 | Behfar | 372/94 |

FOREIGN PATENT DOCUMENTS

GB 2175087 A * 11/1986

OTHER PUBLICATIONS

Chern, G.D. et al., "Directional Laser Emission from Square, Spiral, and Mismatched Semi-Circular Dye-Doped Polymer Based Micropillar Cavities," CLEO/QELS May 2002, pp. 25-26.*

Rex, N.B. et al., "Threshold Lowering in GaN Micropillar Lasers By Means of Spatially Selective Optical Pumping," *IEEE Photon. Tech. Lett* vol. 13, No. 1, Jan. 1, 2001., pp. 1-3.

Rex, N. et al., "Fresnel Filtering in Lasing Emission from Scarred Modes of Wave-Chaotic Optical Resonators," *Phys. Rev. Lett.*, vol. 88, art. No. 094102-1 -094102-4 (2002).

(Continued)

*Primary Examiner*—Minsun Oh Harvey
*Assistant Examiner*—Tod T. Van Roy
(74) *Attorney, Agent, or Firm*—Oliff & Berridge, PLC

(57) ABSTRACT

A locally-outcoupled optical resonator has whispering gallery modes existing in a nearly circular resonator. Light is outcoupled by providing a local perturbing feature on the perimeter of the locally-outcoupled cavity resonator. The perturbing feature provides an outcoupling or loss mechanism that asymmetrically interacts with circulating whispering gallery modes, thereby making the resonator capable of uni-directional output.

48 Claims, 32 Drawing Sheets

OTHER PUBLICATIONS

Poon, A. W. et al., "Multimode Resonances in Square-Shaped Optical Microcavities," *Opt. Lett*, vol. 26, No. 9, May 1, 2001, pp. 632-634.

Tureci, H.E. et al., "Deviation from Snell's Law for Beams Transmitted Near the Critical Angle: Application to Microcavity Lasers," *Opt. Lett.*, vol. 27, No. 1, Jan. 1, 2002, pp. 7-9.

Nockel, J.U. et al., "Ray and Wave Chaos in Asymmetric Resonant Optical Cavities," *Nature*, vol. 385, No. 45 (1997).

Gmachl, C. et al., "High-Power Directional Emission From Microlasers With Chaotic Resonators," *Science* vol. 280, Jun. 5, 1998, pp. 1556-1564.

Nockel, J.U. et al., "Directional Emission from Asymmetric Resonant Cavities," *Opt. Lett.*, vol. 21, No. 19, Oct. 1, 1996, pp. 1609-1611.

Chang, S. et al., "Observation of Emission from Chaotic Lasing Modes in Deformed Microspheres: Displacement by the Stable-Orbit Modes," *J. Opt. Soc. Am. B-Opt. Phys.*, 17 (2002).

Schwefel, H.G.L. et al., "Dramatic Shape Sensitivity of Emissions Patterns for Similarly Deformed Cylindrical Polymer Lasers," *CLEO/QELS* May 2002, pp. 24-25.

Tureci, H.E. et al., "Lasing Emission From Stable and Unstable Modes of Deformed GaN Microdisks," *CLEO/QELS*, May 2002, pp. 23-24.

Chern, G.D. et al., "Directional Laser Emission from Square, Spiral and Mismatched Semi-Circular Dye-Doped Polymer Based Micropillar Cavities," *CLEO/QELS* May 2002, pp. 25-26.

Rex, N.B. et al., "Directional Laser Emission From Chaotic Modes in Quadrupole-Deformed GaN Microdisks," *CLEO/QELS* May 2000, pp. 178-179.

Rex, N.B. et al., "Threshold Minimization and Directional Laser Emission From GaN Microdisks," *SPIE* Jan. 2000, pp. 163-169.

Rex, N.B. et la., "Lasing in GaN Micropillar Cavities of N-Polygons: Polygonal Modes and Increased Directionality, " *OSA* Sep. 28, 1999.

Chang, S. et al., "Laser Emission From Deformed Microcavities: Chaotic and Regular Orbits," *OSA* Oct. 7, 1998.

Chang, R. K. et al., "Stimulated Emission Within a Nonspherical Microcavity," *OSA* Oct. 16, 1998.

Levi, A.F.J. et al., "Directional Light Coupling from Microdisk Lasers," *Appl. Phys. Lett.* 62 (6) (1993), pp. 561-563.

Sakai, A. et al., "FDTD Simulation of Photonic Devices and Circuits Based on Circular and Fan-Shaped Microdisks," *J. Lightwave Tech.* 17 (8) (Aug. 1999), pp. 1493-1499.

McCall, S.L. et al., "Whispering-Gallery Mode Microdisk Lasers," *Appl. Phys. Lett.* 60, pp. 289-291, (Jan. 1992).

Levi, A.F.J. et al., "Room-Temperature Lasing Action in $In_{0.51}Ga_{.0.49}P/In_{0.2}Ga_{0.8}As$ Microcylinder Laser Diodes," *Appl. Phys. Lett.*, 62 (17), Apr. 1993, pp. 2021-2023.

* cited by examiner

LOCALLY-OUTCOUPLED CAVITY RESONATOR HAVING UNIDIRECTIONAL EMISSION

This non-provisional application claims the benefit of U.S. Provisional Application No. 60/430,000, filed Nov. 27, 2002, which is incorporated herein by reference in its entirety.

REFERENCE TO GOVERNMENT CONTRACT

This invention was made with Government support by the Air Force Office of Scientific Research, under Contract No. F33615-02-2-6066, and by the DARPA SUVOS Program under SPAWAR Systems Center Contract No. N66001-02-C-8017, and the Government has certain rights in this invention.

BACKGROUND OF THE INVENTION

1. Field of Invention

This invention is directed to optical resonators and optical devices involving optical resonators as a component.

2. Description of Related Art

Optical resonators are components in optical devices such as lasers, filter, modulators, converters and light-emitting diodes. An important class of optical resonators are dielectric cavity resonators, which have been used to make dielectric cavity lasers, filters and other devices. Dielectric cavity lasers operate by providing feedback to an optical gain medium, by total or near-total internal reflection at a dielectric interface forming the walls of the resonator bounding the gain medium. Well-known examples are disk and cylinder lasers that emit from whispering gallery modes that circulate around the perimeter of the cavity. Disk and cylinder lasers have been proposed and fabricated, in which a laser diode structure is formed with a circular cross-section. The larger the diameter of the circular resonator, the less evanescent leakage there is from whispering gallery modes, which effectively increases the reflectivity of the sidewalls and increases the Q of the resonator. Therefore, large diameter circular disk and cylinder lasers have a relatively large gain×length product, and are capable of exceedingly low threshold currents.

One of the disadvantages of circular dielectric cavity lasers is that light output only occurs through near-field evanescent leakage through the side walls. This occurs because the incidence angle of the light on the walls is above the critical angle for total internal reflection. Therefore, coupling light into or out of the resonator is accomplished primarily by near-field coupling. Consequently, an input or output fiber has to be placed sufficiently close to the resonator that the evanescent fields that link the optical regions of the dielectric cavity laser and the fiber are appreciable. Therefore, positioning the input/output fiber with respect to the resonator has to be carefully controlled and the output power tends to be low.

Another disadvantage of circular dielectric cavity lasers is that the laser emission is isotropic. That is, light is emitted from the circular dielectric cavity laser equally from all circumferential positions, i.e. equally along all 360° of the outer surface of the circular dielectric cavity laser. As a result, the light output from circular dielectric cavity lasers cannot be focused by the usual optics and injected into, for example, a fiber optic cable without large losses. For these reasons, there are few applications for circular dielectric cavity lasers.

A number of alternative dielectric cavity laser designs attempting to localize the output of a dielectric cavity laser into well-defined directions have been proposed. One such alternative design is referred to as an asymmetric resonant cavity laser. The asymmetric resonant cavity laser is a dielectric cavity laser with a cross-section smoothly deformed from circular symmetry. Such lasers can emit from either deformed whispering gallery modes or from librational modes such as the bow-tie mode.

FIG. 1 shows one exemplary embodiment of an asymmetric resonant cavity laser, which emits from the points of maximum curvature 11 and 13 located near the poles 10 and 12 of the cavity. The asymmetric resonant cavity laser shown in FIG. 1 has two degenerate directions in which the whispering gallery modes can circulate, clockwise or counterclockwise. The asymmetric resonant cavity laser can be fed by a waveguide 14 located on the top of the device. As shown in FIG. 1, the waveguide 14 couples an optical signal λ into the asymmetric resonant cavity laser, into the clockwise circulating whispering gallery mode. The asymmetric resonant cavity laser outputs the light 20 along a tangent to the point of maximum curvature 13, into an output fiber 16, at the point of maximum curvature 13. The device may also output some of the generated light back into the input fiber 14, as the asymmetric resonant cavity laser generally outputs at least two emitted beams 18 and 20, each emitted along the tangent lines at each point of maximum curvature 11 and 13.

Another embodiment of an asymmetric resonant cavity optical device is the librational mode semiconductor laser, which emits from a bow-tie mode that does not circulate around the periphery. The boundary of this laser resonator is smooth and the beams are not outcoupled by a local perturbation. This laser has high output power and directional emission but produces four output beams.

SUMMARY OF THE INVENTION

Such bi-directional or multi-directional emissions are undesirable for a number of reasons, including low beam intensity because the output modes are shared by the two emitted beams. For a variety of applications, bi-directional or multi-directional emission is inappropriate. Accordingly, a dielectric cavity laser having a single emitted beam would be useful.

This invention provides dielectric optical resonators having one or more localized perturbations resulting in uni-directional emission outcoupled from each localized perturbation.

This invention separately provides spiral-shaped uni-directionally emitting locally-outcoupled cavity resonators having one or more localized perturbations.

This invention separately provides semi-circular locally-outcoupled cavity resonators having one or more localized perturbations.

This invention further provides uni-directional semi-circular locally-outcoupled cavity resonators having one or more localized perturbations.

This invention separately provides locally-outcoupled cavity resonators having one or more localized perturbations that asymmetrically outcouple the circulating clockwise and counterclockwise modes to obtain uni-directional emission.

In various exemplary embodiments, the locally-outcoupled cavity resonators having one or more localized perturbations according to this invention asymmetrically couple to the clockwise and counterclockwise circulating modes, such that one mode direction is strongly coupled out of each localized perturbation of the locally-outcoupled cavity resonator, while the other mode direction is very weakly coupled out of that localized perturbation of the locally-outcoupled cavity resonator. Consequently, in various exemplary embodiments, the outcoupled mode is emitted at one location along the circumference of the locally-outcoupled cavity resonator, while the other modes are not outcoupled at all.

In various exemplary embodiments, the locally-outcoupled cavity resonator is formed by establishing a sudden change in radius along the circumference of the locally-outcoupled cavity resonator. In various exemplary embodiments, the radius of the locally-outcoupled cavity resonator changes continuously from 0 to $2\pi$ along the circumference, such that a step change in radius occurs between positions $2\pi(-)$ and $2\pi(+)$ along the circumference.

In various other exemplary embodiments, a first half of the locally-outcoupled cavity resonator has a first radius over at least one-half of the circumference, and a second radius which is different than the first radius, over at most one-half of the circumference. Because of the different radii, if the two portions are aligned at one radius change location, a step-change in radius will occur at the other radius change location.

In various other exemplary embodiments, the two portions of different radii are concentric, so that there are two step changes in radius along the circumference. In this case, each step change in radius asymmetrically interacts with different ones of the clockwise and counterclockwise circulating modes, such that one type of mode is preferentially outcoupled from each step change in radius.

In various other exemplary embodiments, an asymmetrically positioned and/or shaped localized perturbation preferentially outcouples one of the clockwise and counterclockwise circulating modes. In various exemplary embodiments, the localized perturbation is prism-shaped, while, in various other exemplary embodiments, the localized perturbation is rounded or lenticular. In various other exemplary embodiments, a prism-shaped section is removed from the side wall to preferentially outcouple one of the clockwise or counterclockwise circulating modes.

These and other features and advantages of this invention are described in, or are apparent from, the following detailed description of various exemplary embodiments of the systems and methods according to this invention.

BRIEF DESCRIPTION OF THE DRAWINGS

Various exemplary embodiments of the devices, systems, and/or methods according to this invention will be described in detail, with reference to the following figures, wherein.

DETAILED DESCRIPTION OF EXEMPLARY EMBODIMENTS

Figure 1:
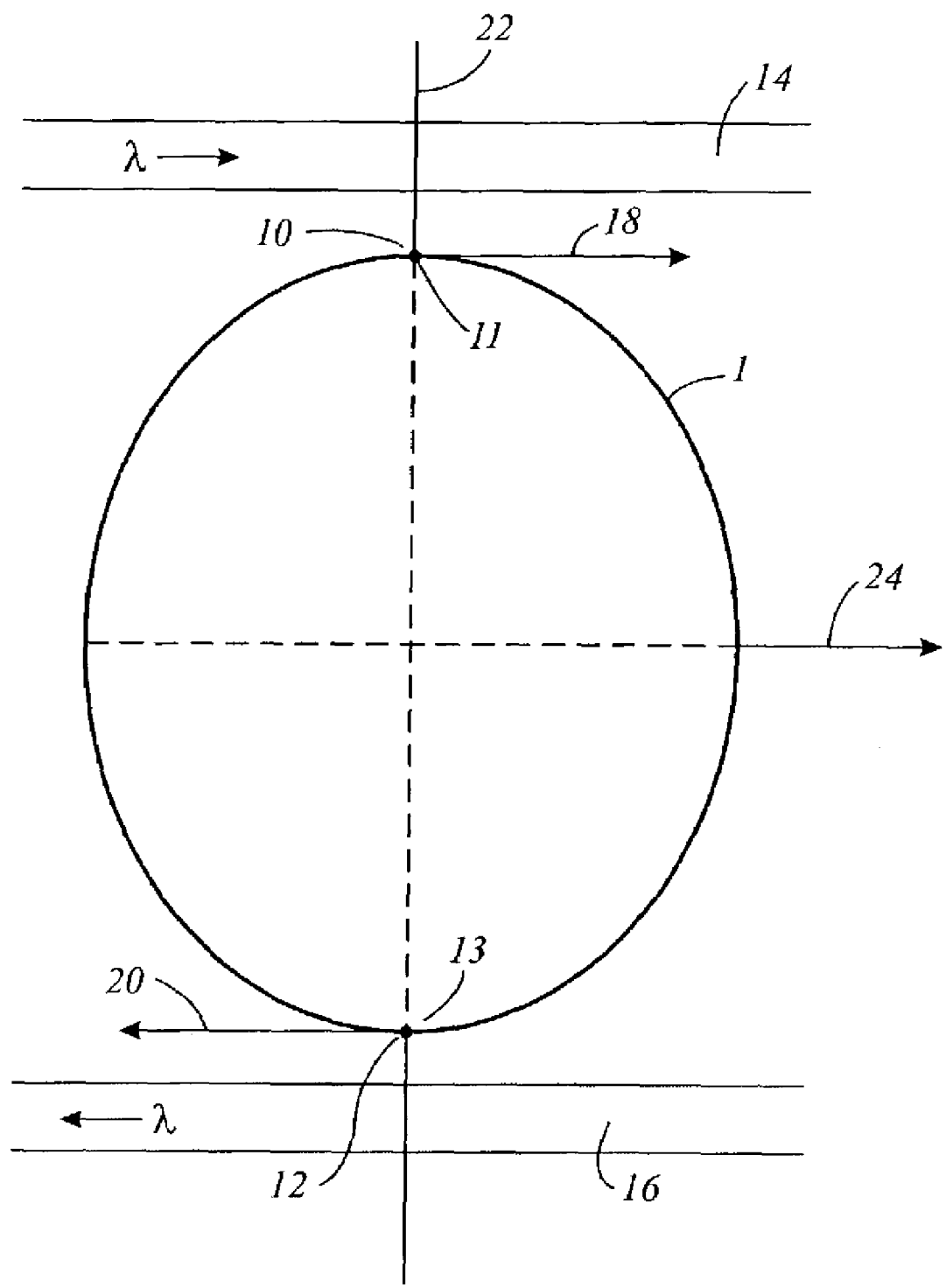
FIG. 1 is a simplified schematic diagram of a known asymmetric resonant cavity laser structure.

FIG. 1 shows a known embodiment of an asymmetric resonant cavity 1, wherein two axes of discrete symmetry 22 and 24 remain in the shape of the non-circular resonator 1. Because of the quadrupolar shape of the asymmetric resonant cavity 1, there is a point of maximum curvature 11 and 13 at each pole 10 and 12, respectively. Modes circulating in both the counterclockwise and clockwise directions in the asymmetric resonant cavity 1 are low loss, and therefore high gain. Because of the discrete symmetry of the asymmetric resonant cavity 1, the clockwise and counterclockwise modes are degenerate, and each mode will output one beam at each point of maximum curvature 11 and 13. Therefore, if this asymmetric resonant cavity 1 were to be electrically pumped, four output beams would be produced, one for each circulating mode, for each point of maximum curvature 11 and 13. Therefore, this non-circular resonator 1 is not uni-directional, in that at least four output beams are produced when the modes are electrically pumped.

Various exemplary embodiments of the locally-outcoupled cavity resonator according to the invention described herein have at least one abrupt deformation, or localized perturbation, of the boundary that provides the local outcoupling. That is, each abrupt deformation or localized perturbation acts as an outcoupling aperture. The abrupt deformation or localized perturbation breaks the symmetry of clockwise and counterclockwise circulating modes. The resonator is therefore capable of emitting only one beam from each abrupt deformation or localized perturbation upon being electrically excited. The various locally-outcoupled optical resonators according to this invention have one or more outcoupling apertures that each couples differently to each of the clockwise and counterclockwise propagating modes. That is, in the various locally-outcoupled cavity resonators according to this invention, one of the pair of mode types will be strongly outcoupled at each outcoupling aperture, while the other of the pair of mode types is very weakly outcoupled at that outcoupling aperture. Because the loss seen by the clockwise circulating modes is different from the loss seen by the counterclockwise circulating mode, the degeneracy of the modes is lifted. Therefore, essentially a single mode will be coupled out of the resonator at each outcoupling aperture, resulting in uni-directional emission from the resonator at each outcoupling aperture.

The output coupler is in the form of an abrupt physical deformation located along the circumference of an otherwise generally circular or other smoothly curving resonator, to provide a localized perturbation of the resonator. It should be appreciated that, in various exemplary embodiments, abrupt refers to a perturbation having a radius of curvature that is not much larger than the wavelength of the emitted light. The deformation is designed to interact more substantially with one direction of circulating modes than the other direction. In various exemplary embodiments, the output coupler may have a prismatic shape, for example, which preferentially intercepts and outputs one of the modes circulating in a first direction. The output coupler may further include a reflective surface that reflects the non-emitted modes that are circulating in a second direction, changing them into the emitting modes circulating in the first direction.

In various other exemplary embodiments, the output coupler may be in the form of a discontinuity in the radius of the locally-outcoupled cavity resonator. This discontinuity may occur in an otherwise continuously variable radius resonator. The continuously variable radius area provides smooth side walls for total internal reflection over much of the circumference of the device, except for one region, in which a sudden, local discontinuity in the disk radius forms the output coupler.

Figure 2:
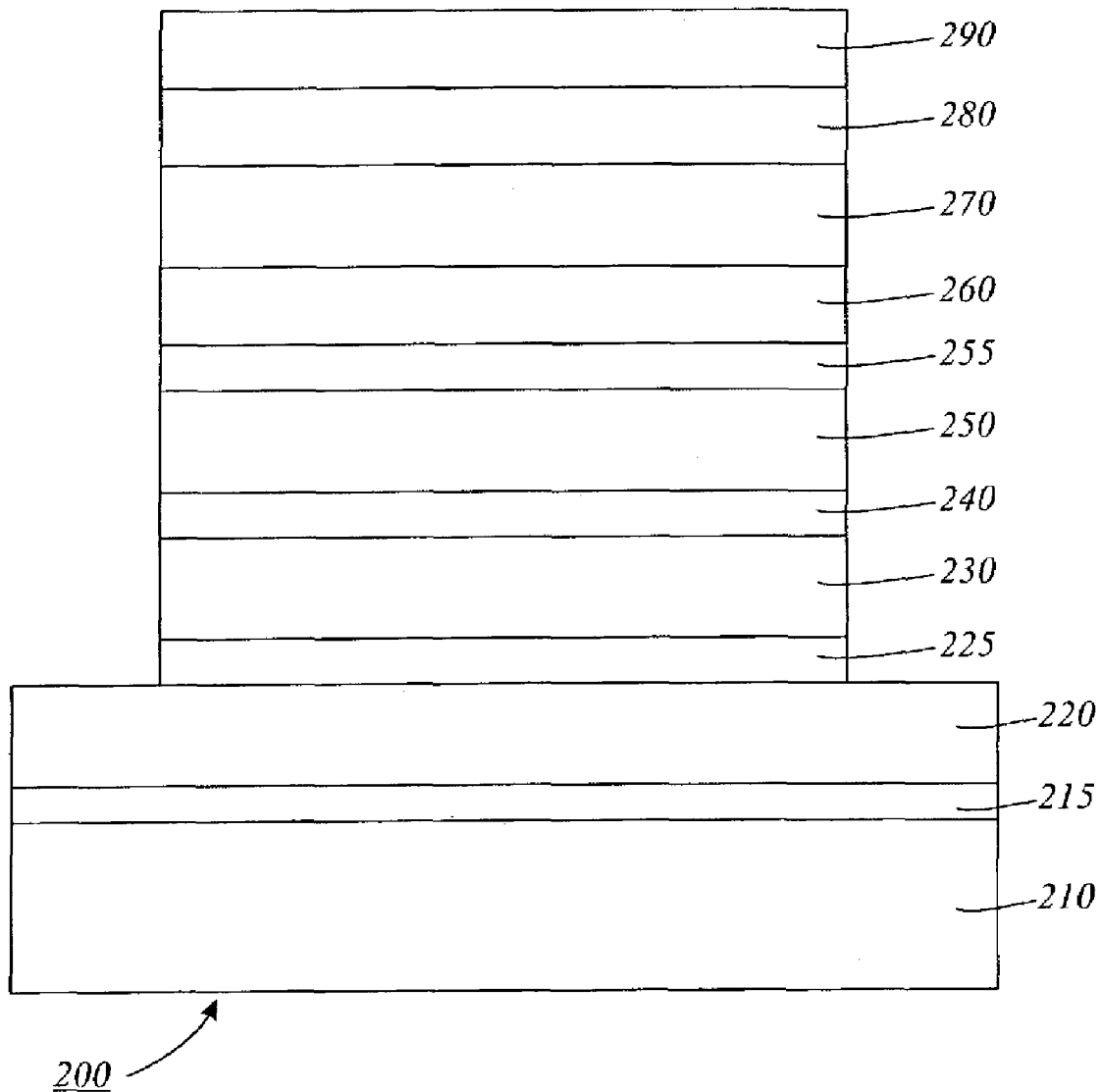
FIG. 2 is a cross-sectional view of a first exemplary embodiment of the layer structure of a locally-outcoupled cavity resonator according to this invention.

The light-emitting device itself may be a III-V nitride laser heterostructure. Such devices are known to lase in the blue-to-ultraviolet portion of the spectrum, and are expected, in the future, to be able to lase in adjacent portions of the spectrum. FIG. 2 shows one exemplary embodiment of the cross-sectional structure of the III-V nitride laser device 200 usable as the locally-outcoupled cavity resonator according to this invention. The layer structure may be fabricated using metal-organic chemical vapor deposition (MOCVD). The III-V nitride laser device is grown on a C-face (0001) or A-face (1120) oriented sapphire ($Al_2O_3$) substrate 210 on which a succession of semiconductor layers is epitaxially deposited. Other possible substrate materials include, for example, silicon carbide (e.g. 6H—SiC or 4H—SiC), GaN, AlGaN, AlN or silicon.

The laser structure includes a thin buffer layer 215, also known as a nucleation layer, formed on or over the sapphire substrate 210. The buffer layer 215 acts primarily as a wetting layer, to provide smooth, uniform coverage of the top surface of the sapphire substrate 210. Typically, the buffer layer 215 is formed of a binary or ternary III-V nitride material, such as, for example, GaN, AlN, InGaN or AlGaN. In various exemplary embodiments, the buffer layer 215 may have a thickness of from about 10 nm to about 30 nm and is typically undoped.

A second III-V nitride layer 220 is formed on or over the buffer layer 215. The second III-V nitride layer 220 is an n-type (Al)(In)GaN current spreading layer. The second III-V nitride layer 220 acts as a lateral n-contact. In various exemplary embodiments, the second III-V nitride layer 220 is n-type GaN:Si or AlGaN:Si with an n-doping concentration in the range of $10^{16}$ to $10^{20}$ $cm^{-3}$. In various exemplary embodiments, the doping concentration is $5 \times 10^{18}$ $cm^{-3}$. In such exemplary embodiments, the second III-V nitride layer 220 has a thickness of from about 1 μm to about 10 μm.

A third III-V nitride layer 225 may be formed on or over the second III-V nitride layer 220. The third III-V nitride layer 225, if used, is a strain compensation and defect reducing layer. In various exemplary embodiments, the third III-V nitride layer 225 is an n-type InGaN:Si with an In content smaller than the InGaN quantum well(s) in the active region 250 and with an n-doping concentration of $10^{16}$ to $10^{20}$ cm$^{-3}$. In various exemplary embodiments, the doping concentration is $5 \times 10^{18}$ cm$^{-3}$. In such exemplary embodiments, the third III-V nitride layer 225 may have a thickness of from about 25 nm to about 200 nm.

A fourth III-V nitride layer 230 is formed on or over the third III-V nitride layer 225, if used, or on or over the second layer 220, if not. The fourth III-V nitride layer 230 is a cladding layer. In various exemplary embodiments, the layer 230 is an n-type (In)AlGaN cladding layer. The fourth III-V nitride layer 230 is typically n-type AlGaN:Si with an Al content larger than the fifth III-V nitride layer 240 and with a n-doping concentration of about $10^{16}$ to about $10^{20}$ cm$^{-3}$. In various exemplary embodiments, the doping concentration is about $1 \times 10^{18}$ cm$^{-3}$. In such exemplary embodiments, the fourth III-V nitride layer 230 has a thickness of from about 0.2 µm to about 2 µm.

A fifth III-V nitride layer 240, which is a waveguide layer, is formed on or over the fourth III-V nitride layer. In various exemplary embodiments, the fifth III-V nitride layer 240 is n-type (In)GaN:Si or (In)GaN:undoped or AlGaN or AlGaInN with the In and Al content chosen such that the refractive index is larger than that of the fourth III-V nitride layer 230 and smaller than that of the InGaN quantum well(s) in an active region 250. In various exemplary embodiments, the thickness of the fifth III-V nitride layer 240 is from about 0.05 µm to about 0.2 µm and has an n-doping concentration of about $10^{16}$ to about $10^{20}$ cm$^{-3}$. In various exemplary embodiments, the doping concentration is about $1 \times 10^{17}$ cm$^{-3}$.

As indicated above, the quantum well active layer 250 is formed on or over the fifth III-V nitride layer 240. In various exemplary embodiments, the quantum well active layer is formed using at least one (In)(Al)GaN quantum well. In various exemplary embodiments, a quantum well active layer 250 having multiple-quantum well active regions, the individual quantum wells may have a thickness of from about 10 Å to about 200 Å. In various exemplary embodiments, the individual quantum wells are separated by (In)(Al)GaN barriers. In various exemplary embodiments, these barriers have a thickness of from about 10 Å to about 200 Å. The (In)(Al)GaN quantum wells and the (In)(Al)GaN barriers are typically undoped. However, in some exemplary embodiments, the (In)(Al)GaN barriers are Si-doped or partially Si-doped. Typical n-doping concentrations are between about $10^{16}$ to about $10^{20}$ cm$^{-3}$. In various exemplary embodiments, the doping concentration is about $5 \times 10^{18}$ cm$^{-3}$. It should be appreciated that in general, the composition of the (In)(Al)GaN quantum wells is chosen such that the band gap energy is smaller than that of the waveguide and cladding layers. One exemplary embodiment of an active region 250 for a laser emitting at 400 nm contains three to five 35-Å-wide InGaN quantum wells, having an indium mole fraction of 8–10%, separated by 65-Å-wide InGaN barriers, having an indium mole fraction of 1–2%.

A sixth III-V nitride layer 255 is formed on or over the quantum well active region 250. The sixth III-V nitride layer acts as a carrier confinement layer. The sixth III-V nitride layer 255 has a higher band gap than the quantum well active region 250. In various exemplary embodiments, the band gap difference is about 0.5 eV. In various exemplary embodiments, the sixth III-V nitride layer 255 is p-type $Al_xGa_{1-x}N$:Mg with an Al mole fraction in the range from $x=0.05$ to $x=0.4$. In such exemplary embodiments, the overall thickness of the sixth III-V nitride layer 255 is typically from about 5 nm to about 100 nm and typically has a p-doping concentration of about $10^{18}$ to about $10^{21}$ cm$^{-3}$. In various exemplary embodiments, the doping concentration is about $1 \times 10^{20}$ cm$^{-3}$.

A seventh III-V nitride layer 260 is formed on or over the sixth III-V nitride layer 255. The seventh III-V nitride layer acts as a waveguide layer. In various exemplary embodiments, the seventh III-V nitride layer 260 is a p-type (In)GaN:Mg, (In)GaN:undoped, AlGaN, or AlGaInN material. In such exemplary embodiments, the In and Al content is chosen such that the refractive index of the seventh layer 260 is larger than that of the sixth III-V nitride layer 255 and is smaller than that of the InGaN quantum well(s) in the active region 250. In various exemplary embodiments, the thickness of the seventh III-V nitride layer 260 is from about 0.05 µm to about 0.2 µm and is undoped or has a p-doping concentration of about $10^{16}$ to about $10^{20}$ cm$^{-3}$. In various exemplary embodiments, the doping concentration is about $1 \times 10^{18}$ cm$^{-3}$.

An eighth III-V nitride layer 270 is formed on or over the seventh III-V nitride layer 260. In various exemplary embodiments, the eighth III-V nitride layer 270 is a p-type (In)AlGaN cladding layer. In various exemplary embodiments, the eighth III-V nitride layer 270 has a thickness of from about 0.2 µm to about 2 µm In various exemplary embodiments, the eighth layer 270 is formed using p-type AlGaN:Mg where the Al content is larger than that of the seventh III-V nitride layer 260. In various exemplary embodiments, the eighth layer 270 has a p-doping concentration of about $10^{16}$ to about $10^{21}$ cm$^{-3}$. In various exemplary embodiments, the doping concentration is about $5 \times 10^{19}$ cm$^{-3}$.

A ninth III-V nitride layer 280 is formed on or over the eighth III-V nitride layer 270. The ninth III-V nitride layer 280 forms a p-doped GaN:Mg or p-doped InGaN:Mg contact layer 280 for a low-resistance metal electrode. In various exemplary embodiments, the ninth III-V nitride layer 280 has a thickness of from about 5 nm to 200 nm. The ninth layer 280 has a p-doping concentration of about $10^{16}$ to about $10^{21}$ cm$^{-3}$. In various exemplary embodiments, the doping concentration is about $1 \times 10^{20}$ cm$^{-3}$. The structure may be capped by a layer of metal electrode material 290. The material choices for the p-metal include, but are not limited to, for example, nickel (Ni), palladium (Pd), platinum (Pt), a nickel-gold alloy (Ni/Au), a palladium/titanium/gold alloy (Pd/Ti/Au), or a platinum/titanium/gold alloy (Pt/Ti/Au).

In various exemplary embodiments, the sapphire substrate wafers are of standard specifications including an epitaxial polish on one side and a typical thickness of 0.25 mm to 0.43 mm (10 mil to 17 mil). If alternative substrate materials are used, such as, for example, GaN or AlN, the second III-V nitride layer 220 can be directly formed on top of the substrate without the nucleation layer 215. The substrate temperatures during growth are typically 550 degrees Celsius for the GaN nucleation layer, 1000 degrees C. to 1100 degrees C. for the GaN and AlGaN layers and 700 degrees C. to 900 degrees C. for the InGaN or InAlGaN layers. In addition, the reactor pressure may be controlled between 50 Torr and 740 Torr. As organometallic precursors for the MOCVD growth, TMGa (trimethylgallium), TMAl (trimethylaluminum), TMIn (trimethylindium) and TEGa (triethylgallium) are used for the group III elements and NH$_3$ (ammonia) is used as the nitrogen source. Hydrogen and/or nitrogen are used as carrier gases for the organometallic precursor gases. For the n-doping, 100 ppm SiH$_4$ is diluted in H$_2$, and for the p-doping Cp$_2$Mg (cyclopentadienylmagnesium) is used. Other examples of p-type dopants include, but are not limited to, Ca, C and Be. Examples of n-type dopants include, but are not limited to Si, O, Se, and Te. In various exemplary embodiments, the overall height of the structure is about 1.5 to about 2.5 microns.

Besides group III nitride semiconductors, a number of other materials can be used to realize locally-outcoupled cavity resonator devices. These other materials include other III-V compound semiconductors, for example, GaAs, InAs, AlAs (including InGaAs, AlGaAs, and InAlAs alloys), InP, AlP, and GaP (including InGaAsP, InGaP and InAlP alloys). These other materials also include II-VI compound semiconductors, such as, for example, ZnSe, CdS, MgS, MgSe, CdSe, CdTe, ZnO, MgO and alloys of and/or between these materials. These other materials also include organic materials, such as, for example, light emitting polymers or light emitting small molecules. In general, any material that can be electrically or optically pumped to produce gain can be used to form the locally-outcoupled cavity resonators according to this invention.

Figure 3:
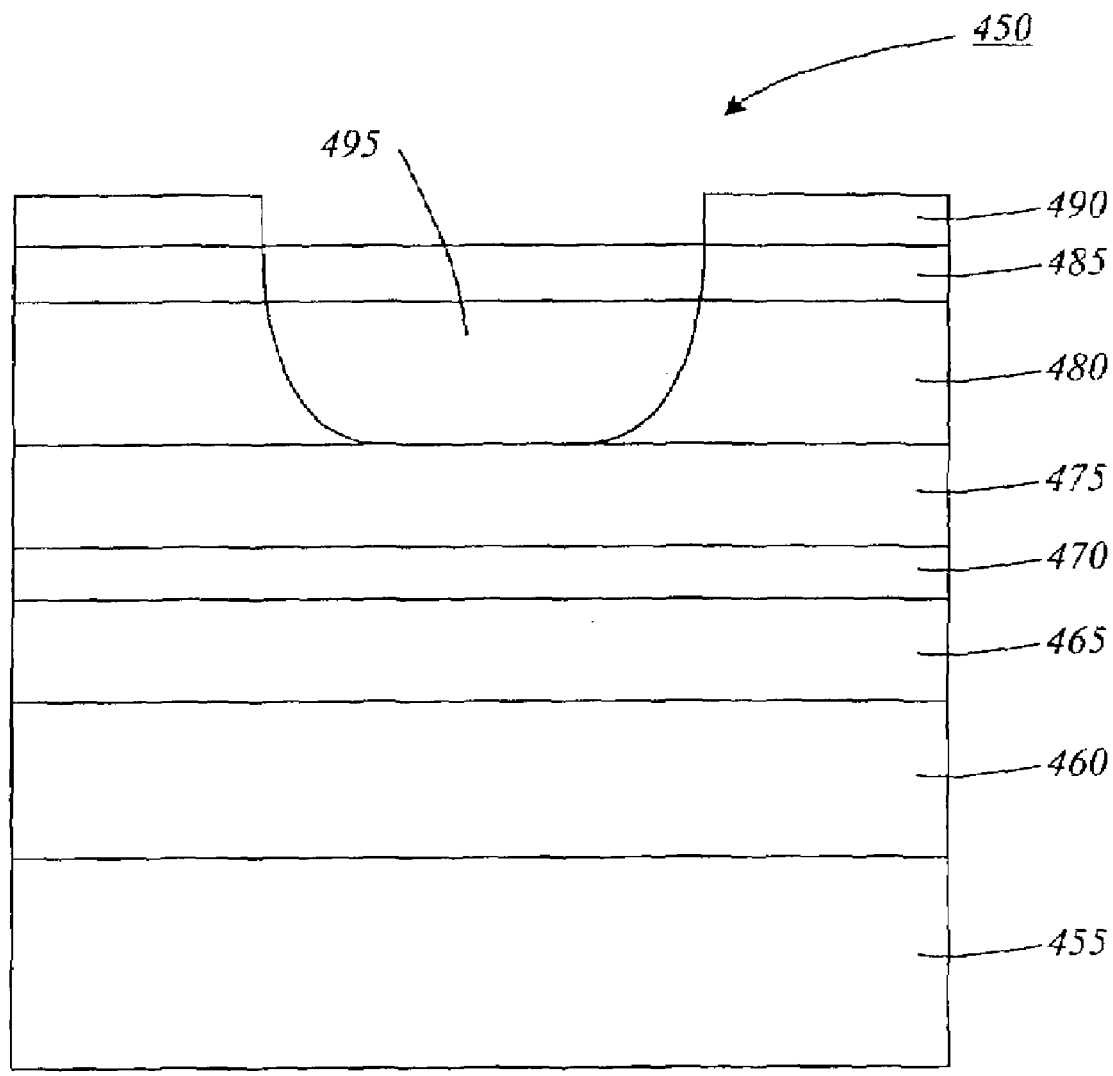
FIG. 3 is a cross-sectional view of a second exemplary embodiment of the layer structure of a locally-outcoupled cavity resonator according to this invention.

An exemplary embodiment of a GaAs-based locally-outcoupled cavity resonator 450 is shown in FIG. 3. The optical and current confinement structure of this GaAs-based locally-outcoupled cavity resonator is very similar to the design for the GaN-based locally-outcoupled cavity resonator structure shown in FIG. 2. In the case of GaAs, the structure can be grown on a GaAs conducting substrate 455. The active region 470 is an InGaAs single quantum well or an InGaAs/GaAs multi-quantum well. Depending on the indium content of the InGaAs quantum well, the emission wavelength will be in the range between 850 nm and 1200 nm. If an AlGaAs or InAlGaAs single quantum well or multi-quantum well active region is used, the emission wavelength can be shorter, such as, for example, about 850 nm to about 700 nm.

Optical and electrical confinement is achieved with a separate confinement heterostructure comprising undoped $Al_{0.4}Ga_{0.6}As$ waveguide layers 465 and 475 and Si- and C-doped $Al_{0.75}Ga_{0.25}As$ cladding layers 460 and 480. Since GaAs and AlAs have almost the same lattice constant, the cladding layers 460 and 480 and waveguide layers 465 and 475 can be grown much thicker and with much higher aluminum concentrations, compared to the AlGaN cladding layers 230 and 270 in the GaN-based structures shown in FIG. 2. GaAs-based laser structures do not normally require the current confinement layer used in the GaN-based devices, because of the larger band offset between the cladding layers 460 and 480 and the corresponding waveguide layers 465 and 475, and/or the larger diffusion length of electrons and holes in these materials. The same is true for the other III-V compound lasers and II-VI semiconductor materials. In addition, by using a conductive substrate, such as, for example, the Si-doped GaAs substrate 455, the n-contact can be made through the backside of the substrate 455 instead of using a lateral n-contact ring electrode, as in the exemplary embodiment of the GaN laser grown on an insulating sapphire substrate shown in FIG. 2.

Since the p-layer conductivity in GaAs and other III-V and II-VI materials is much higher than in GaN-based structures, it may be necessary to electrically isolate the center portion of disk from the p-contact ring electrodes and the p-layers in the laser structure. This can be achieved, for example, by proton implantation in area 495 with high energy (10 to several 100 keV) protons, and a post implantation anneal to remove defects caused by the implantation process. Instead of proton implantation in the area 495, the center portion of the disk could be removed by dry and/or wet etching. The materials for the p- and n-contacts for the GaAs-based laser might also be different from the examples given for the GaN-based laser. Typical n-contacts for a GaAs-based laser are AuGe alloys, Ge/Au/Ni/Au or Sn/Au. Cr/Au, Zn/Au, Au/Zn/Au, Pt/Au, Ni/Au, or Ti/Pt/Au are used as p-contact materials.

Figure 4:
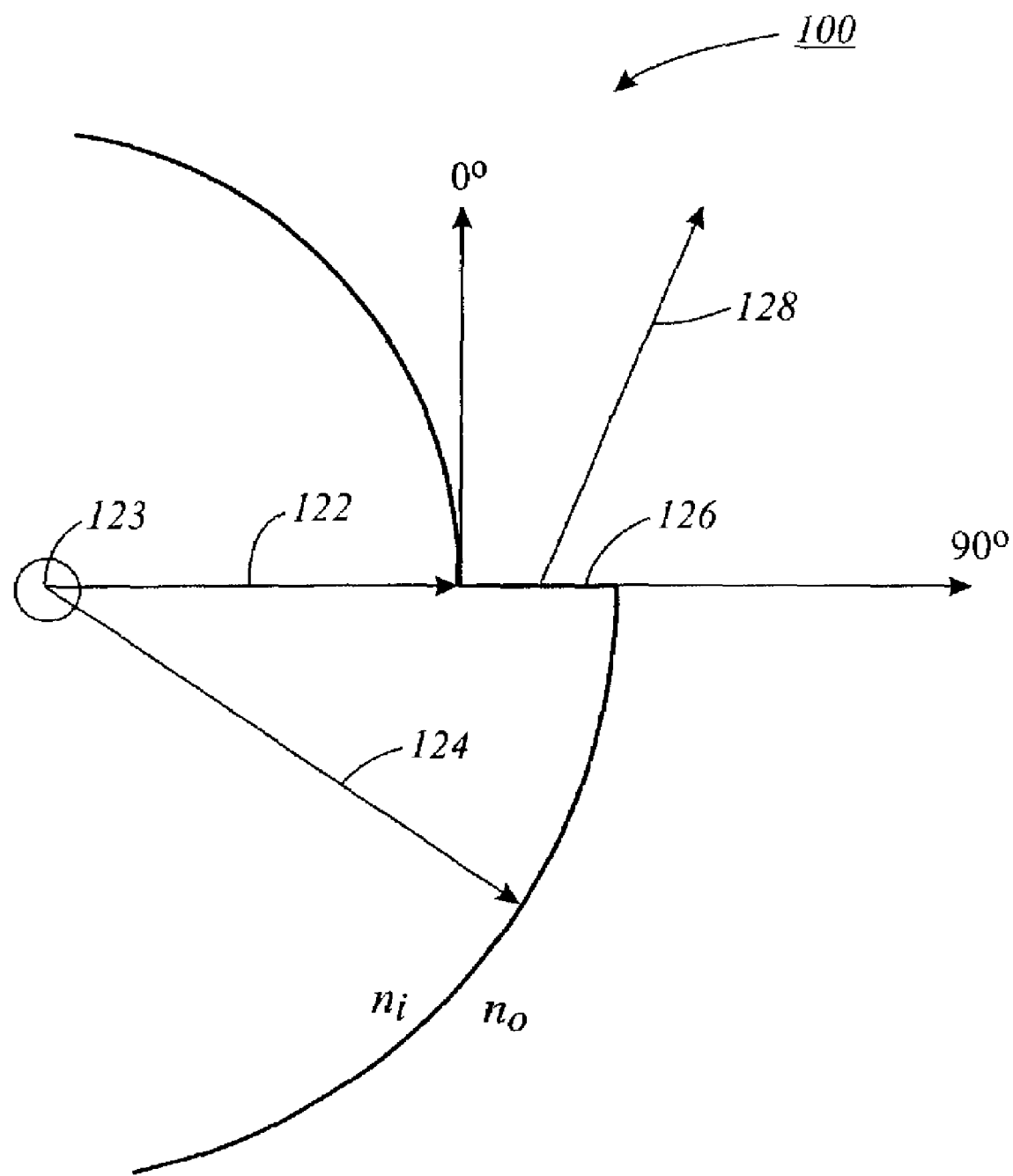
FIG. 4 illustrates a portion of a first exemplary embodiment of the shape of a locally-outcoupled cavity resonator according to this invention.

FIG. 4 illustrates a portion of a first exemplary embodiment of a uni-directional locally-outcoupled cavity resonator 100 according to this invention, in which the optical resonator is formed in a spiral shape. The locally-outcoupled cavity resonator can use the layer structure shown in either FIG. 2 or FIG. 3. The first radius 122 shown in the figure is a minimum radius r of the spiral, located at $\theta=0°$. The radius increases smoothly from $r_0$ to $r_\theta$ for $0<\theta<2\pi$, where $\theta$ is the rotation angle about the spiral center 123. The radius increases according to the formula $r_\theta=r_0(1+\in\theta/2\pi)$, where $\in$ is the spiral deformation parameter. The gain of the locally-outcoupled cavity resonator 100 occurs mainly in the periphery following the outline of the spiral shape. Modes existing along the perimeter of the locally-outcoupled cavity resonator are reflected by total internal reflection, and create the laser emission 128. The laser emission 128 exits the locally-outcoupled cavity resonator from an output aperture 126, as shown in FIG. 4. In this first exemplary embodiment of the locally-outcoupled cavity resonator, the output aperture 126 is formed at the discontinuity between the maximum radius 124 at $\theta=2\pi$, and the minimum radius 122 at $\theta=0°$, i.e. between $\theta$ being just less than $2\pi(2\pi(-))$ and being just greater than $2\pi(2\pi(+))$.

The choice of the base radius $r_0$ depends in part on the threshold current density one wishes to apply to the locally-outcoupled cavity resonator. The larger the base radius, the higher the gain×length product and the lower the threshold current density. However, the larger the radius, the lower the density of locally-outcoupled cavity resonators that can be fabricated in a given wafer area. The smaller the base radius, the higher the internal losses in the device, and the lower the Q of the locally-outcoupled cavity resonator.

The choice of spiral deformation parameter $\in$ determines the size of the output aperture 126. The far field intensity pattern is a function of the size and shape of the output aperture 126. For example, the corner of the output aperture may not be perfectly sharp, but instead may have a convex shape or concave shape. A convex shape is expected to reduce the fraction of light scattered by the output aperture, whereas the concave shape is expected to increase the fraction of light scattered by the output aperture. Therefore, the far field divergence angle may depend, to a degree, on the detailed shape of the corner of the output aperture. In various exemplary embodiments, the size of the convex or concave shape to the corner of the output aperture is on the order of the wavelength of the emitted modes.

The far field pattern will also depend on the value chosen for $\in$. The smaller the value for $\in$, the lower the single pass loss in the locally-outcoupled cavity resonator and the lower the threshold current density. However, in one implemented embodiment, for values of $\in$ that are less than about 0.05, a second lobe appears in the far field pattern. For values of $\in$ greater than about 0.15 in this implemented embodiment, the far field pattern shows a broad angular divergence. Values of $\in$ around 0.10 in this implemented embodiment yielded a far field output pattern with a 30° divergence angle. The output aperture 126 was disposed at an angle of 90° with respect to the tangent to the spiral at $\theta=0°$.

In the first exemplary embodiment of the locally-outcoupled cavity resonator shown in FIG. 4, the minimum radius may be, for example, 700 μm, with a spiral deformation parameter of, for example, 0.10. Such a locally-outcoupled cavity resonator has been found to produce a highly directional output beam with a single lobe.

In various exemplary embodiments, the spiral locally-outcoupled cavity resonator 100 shown in FIG. 4 was created by etching the III-V nitride heterostructures using chemically assisted ion beam etching (CAIBE). In various exemplary embodiments, to provide desirable gain in the resonator, the side walls of the device should be made as smooth and as nearly vertical as possible. Chemically assisted ion beam etching can result in very smooth and vertical side walls. However, any other known or later developed technique, or combination of techniques, that provides sufficiently smooth and vertical side walls can be used.

The chemically assisted ion beam etching process includes two components. First, argon ions are formed in an electron cyclotron resonance (ECR) plasma source. The argon ions are then accelerated by a potential drop of 200–800 volts between an acceleration grid and the sample stage. In various exemplary embodiments, the argon ions are accelerated at around 500 volts. The argon ion beam provides the physical etching component of the device processing. Chemical assistance comes from a shower head located above the substrate that injects the chemical etchant gases. The flow rates of gases, the energy of the ion beam, and the temperature of the substrate all affect the smoothness and verticality of the side walls. Increasing the chemical etch rate or increasing the temperature of the substrate may create more vertical side walls but with a rougher surface. In various exemplary embodiments, using the argon ion plasma alone will generate a 10–15° sloped side walls with the same surface roughness. However, using the chemical assistance increases the etch rate and gives more vertical side walls.

For the embodiment described above with respect to FIG. 2, the samples were etched in a commercial chemically assisted ion beam etching system from Technics Plasma (Kirchheim, Germany, model Ribetch 160 ECR LL). After patterning the InAlGaN heterostructure shown in FIG. 2 with photoresist, the samples were etched using chemically assisted ion beam etching in a mixture of boron trichloride and chlorine. The argon flow rate was in the range between 2 sccm and 20 sccm to form an Ar ion plasma with a plasma voltage of 500 volts. In various exemplary embodiments, the Ar flow rate was about 5 sccm. The boron trichloride ($BCl_3$) flow rate was in the range between 0 sccm and 20 sccm. In various exemplary embodiments, the boron trichloride flow rate was 2 sccm. The chlorine ($Cl_2$) flow rate was in the range between 1 sccm and 20 sccm. In various exemplary embodiments, the chlorine flow rate was 8 sccm. The sample temperature during the etching process was in the range between 20 to 150° C. Atomic force microscopy performed on the resulting side wall surface indicated that a root-mean-square (rms) roughness of 40–80 Å was obtained for the surfaces formed by chemically assisted ion beam etching under these conditions.

It should be appreciated that chemically assisted ion beam etching is only one of several dry-etching methods that can be used to form the structure shown in FIG. 4. Other methods include, for example, reactive ion etching (RIE), inductive-coupled plasma etching (ICP), and photo-enhanced wet chemical etching. When other material systems are used, such as, for example, GaAs or InP, the dry etching processes will be different and specific to the respective chemistry involved. Furthermore, wet etching processes or a combination of dry etching and wet etching can also be used.

The resonator modes of the spiral locally-outcoupled cavity resonator are whispering gallery modes that occur near the periphery of the spiral locally-outcoupled cavity resonator. The resonator modes circulate around the spiral center by total internal reflection at the side walls. Reflection of the light occurs at the interface between the structure and air, because of the discontinuity in the relative indices of refraction between the layer structure and air. The critical angle, above which the light is totally internally reflected, for GaN and air is about 24°, and for GaAs and air is about 17°.

The resonator emission emerges from the output aperture 126. In particular, the output aperture 126 couples out some of the circulating modes into propagating (rather than evanescent) light waves. Therefore, the output of the spiral locally-outcoupled cavity resonator can be collected several millimeters away from the output aperture 126, rather than a sub-micron distance away as would be the case with evanescent wave coupling. The outcoupling mechanism is therefore fundamentally different from the asymmetric resonant cavity resonators shown in FIG. 1, where the outcoupling was achieved by near-field evanescent coupling between the laser resonator 1 and a nearby optical fiber 14 or 16.

Figure 5:
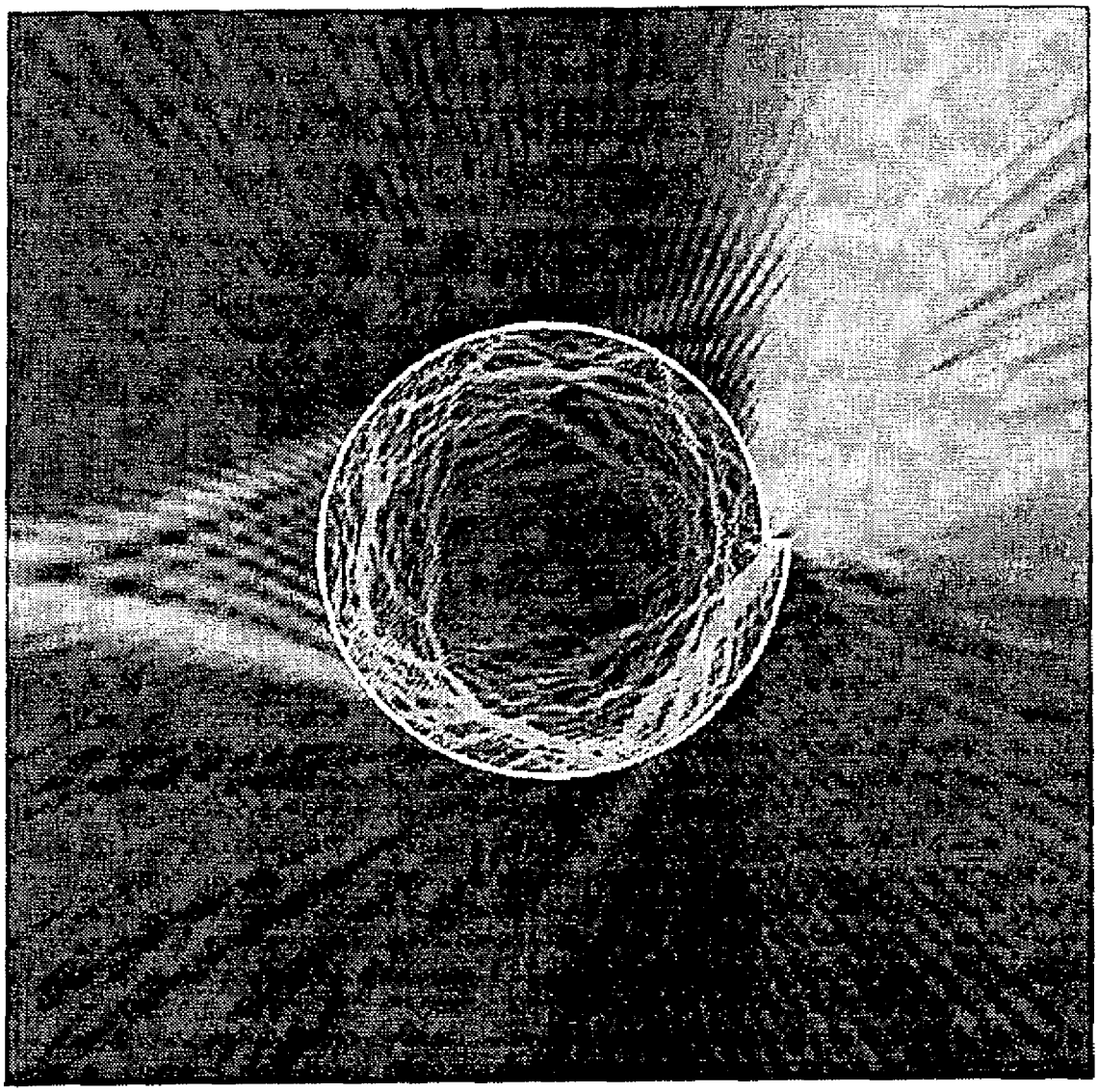
FIG. 5 shows the results of a numerical simulation of the whispering gallery modes in the locally-outcoupled cavity resonator shown in FIG. 4.

The intensity of the whispering gallery modes can be calculated numerically. FIG. 5 shows the results of such a calculation for the spiral locally-outcoupled cavity resonator. In FIG. 5, the modes are shown to be circulating with high intensity near the periphery of the spiral locally-outcoupled cavity resonator as expected, and to be exiting at the output aperture 126. FIG. 5 also shows that the modes are scattered at the inner corner of the output aperture 126. This scattered light can be amplified through the center of the spiral locally-outcoupled cavity resonator, and the amplified signal exits through the left side of the spiral locally-outcoupled cavity resonator as shown in FIG. 5, creating a source of loss in the spiral locally-outcoupled cavity resonator.

The whispering gallery modes shown in FIG. 5 can be excited either electrically, by applying a voltage between the p-electrodes and the n-electrodes, or optically by applying light to the surface of the locally-outcoupled cavity resonator 100.

Optical excitation can be applied to the spiral locally-outcoupled cavity resonator by a frequency tripled 355 nm or quadrupled 266 nm Nd:YAG Q-switched laser. A laser repetition rate of 1 hertz can be used to avoid heating the spiral locally-outcoupled cavity resonator. The spiral locally-outcoupled cavity resonator can be mounted on a translational stage and the pump beam focused on the locally-outcoupled cavity resonator at normal incidence to the top face of the locally-outcoupled cavity resonator 100. The light is applied either isotropically over the top surface (flood pumping) or is focused onto the peripheral areas only, by an annular aperture (ring-pumping). Light emission from the side walls of the locally-outcoupled cavity resonator 100 was imaged with a camera lens into either a spectrometer for spectral analysis or an intensified charge couple device (ICCD) for spatial imaging. Spirals of various deformations ($\in=0.05$ 0.10 and 0.15) and sizes (d=100, 300 and 500 microns) for the various samples of the locally-outcoupled cavity resonator 100 were investigated. Data is shown in FIGS. 6–9 for the larger diameter (d=500 microns) medium eccentricity ($\in=0.10$) samples of the locally-outcoupled cavity resonator 100. These samples had the lowest thresholds and narrowest emission lobes.

Figure 6:
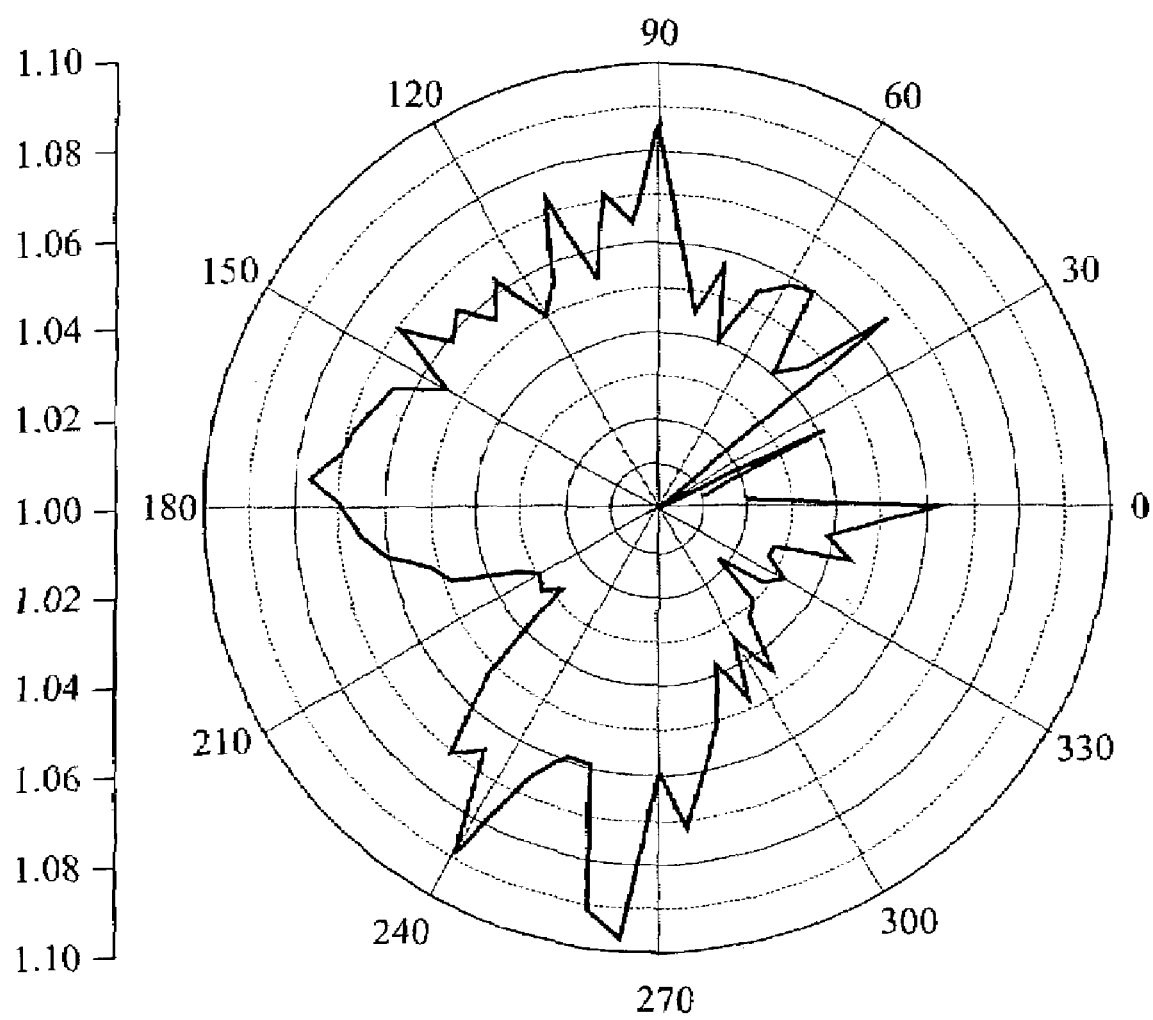
FIG. 6 shows the angular distribution of light emitted from the output aperture of the locally-outcoupled cavity resonator of FIG. 4, when the device is optically pumped below the lasing threshold.
Figure 7:
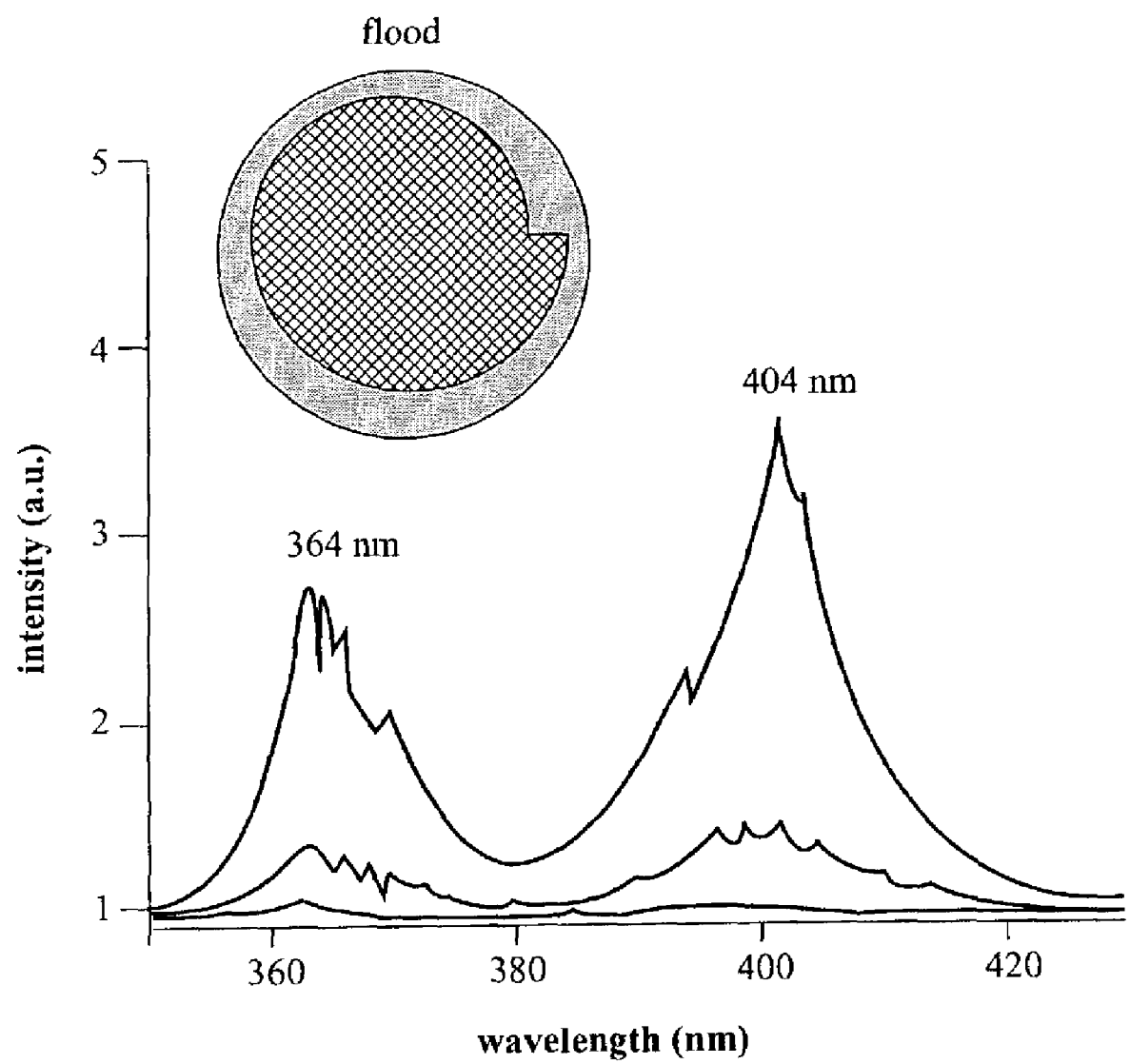
FIG. 7 shows the spectrum of emission from the output aperture of the locally-outcoupled cavity resonator of FIG. 4, when the device is optically pumped below the lasing threshold.

FIG. 6 shows the relatively isotropic output of these samples of the locally-outcoupled cavity resonator 100 when optically pumped below the lasing threshold. The data is taken with the optical pumping applied to the whole top surface of the locally-outcoupled cavity resonator 100 (flood pumping). The emission produced at the output aperture 126 is isotropic, occurring in all directions relatively uniformly. FIG. 7 shows the spectrometer output when the spiral 100 is flood-pumped by the Nd:YAG laser. The flood pumping excites a first peak at 364 nm, which results from the bandgap recombination process in the GaN:Mg layers above the multi quantum wells. A second peak occurs at 404 nm, and is associated with localized exciton recombination in the InGaN multi quantum wells. The laser action therefore takes place at the 404 nm wavelength.

Figure 8:
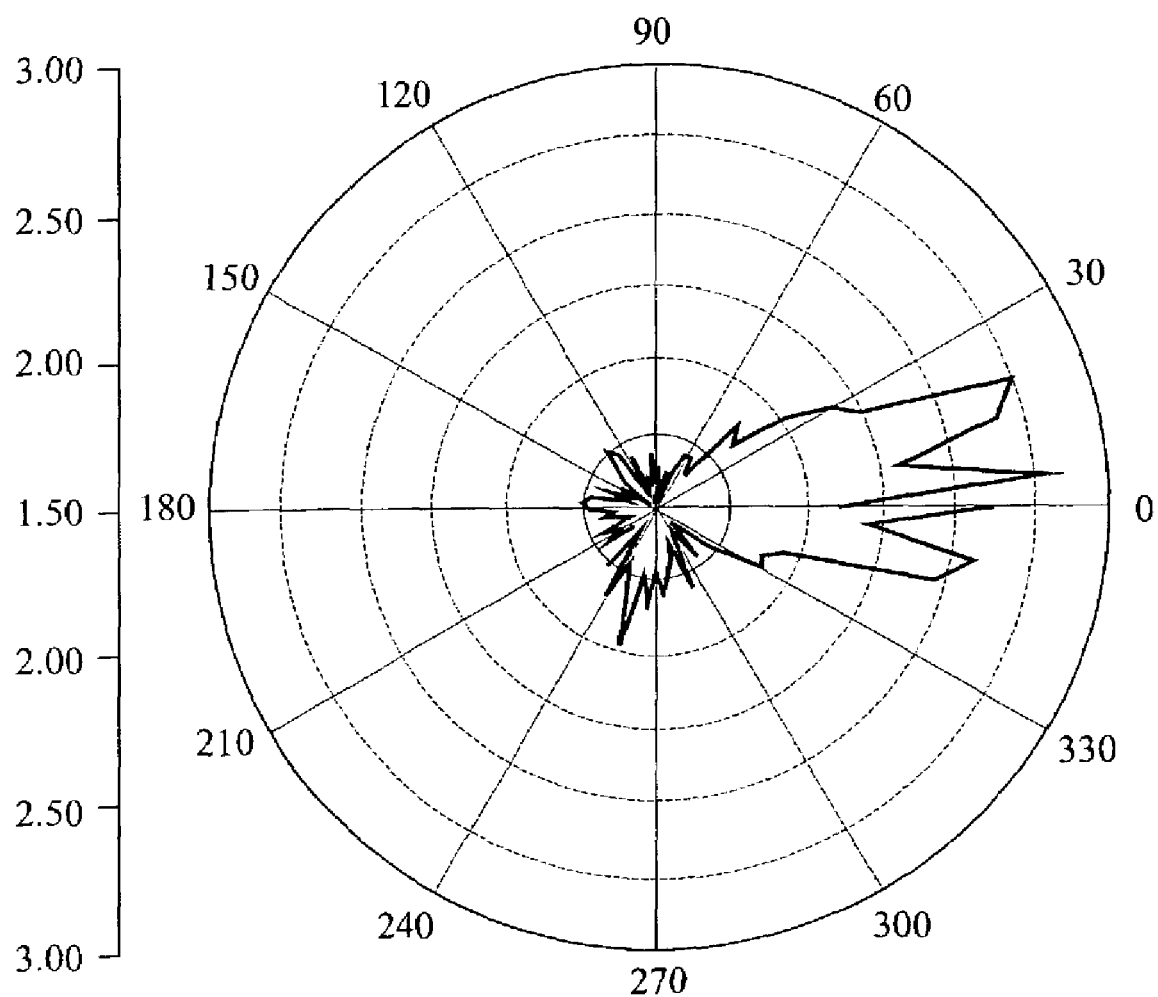
FIG. 8 shows the angular distribution of light emitted from the output aperture of the locally-outcoupled cavity resonator of FIG. 4, when the structure is optically pumped above the lasing threshold.

When the optical pump powers increase to beyond the lasing threshold, as shown in FIG. 8, strong directionality appears in the spatial image of the detected light output from the output aperture 126. The directional output signals the onset of laser action in the locally-outcoupled cavity resonator 100. This polar plot is obtained by integrating over image profiles taken at 5° intervals of the camera angle $\theta_{ICCD}$ defined such that at $\theta_{ICCD}=0$, the detected emission is normal to the output aperture 126.

Figure 9:
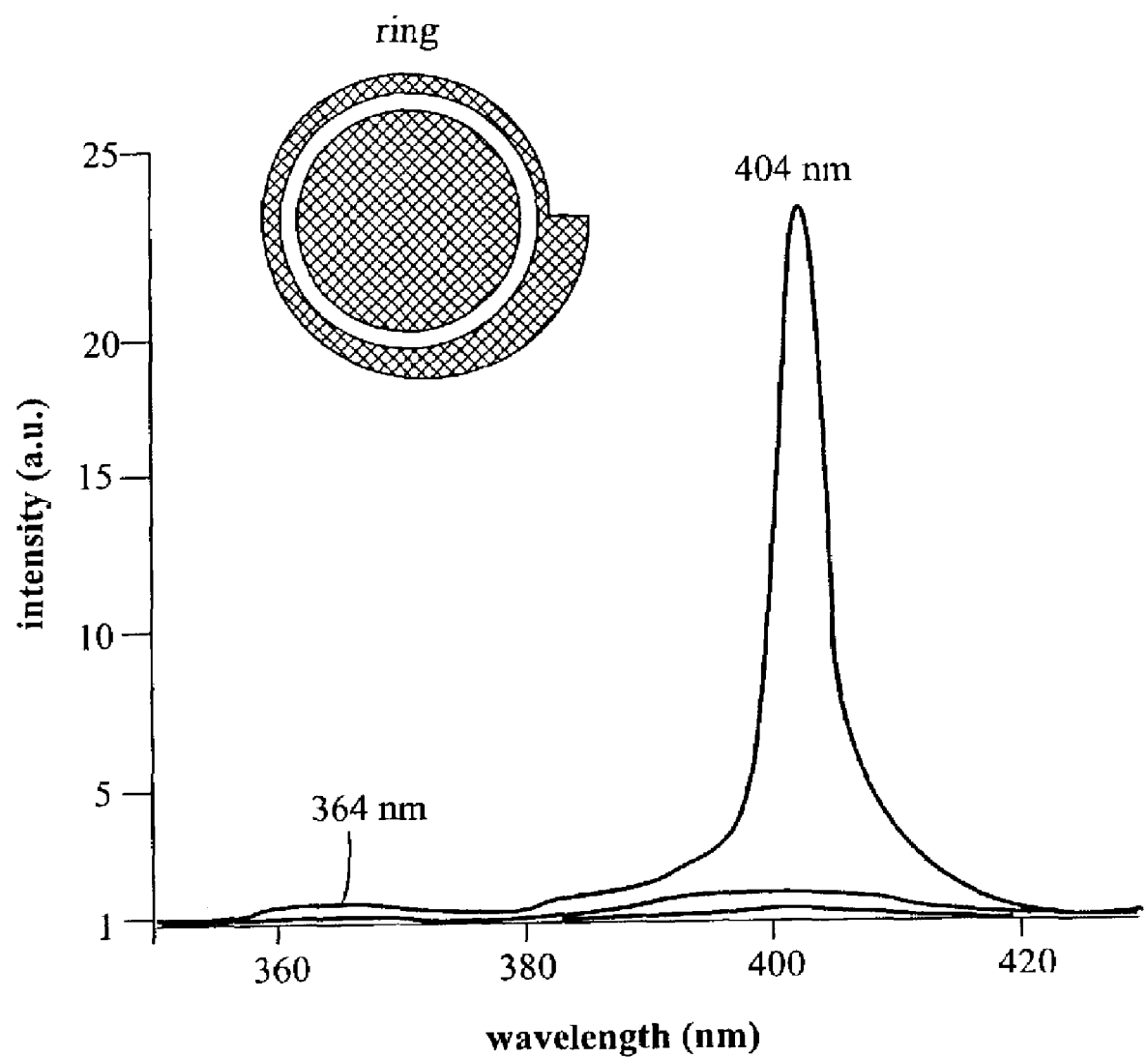
FIG. 9 shows the spectrum of emission from the output aperture of the locally-outcoupled cavity resonator of FIG. 4, when the device is optically pumped above the lasing threshold.

The transition between amplified spontaneous emission and true lasing action can be shown in the abrupt increase in output power at 404 nm from the locally-outcoupled cavity resonator 100 between flood pumping, as shown in FIG. 6, compared to ring pumping, as shown in FIG. 9. The spectrograph shows two broad peaks emerging from the output aperture in FIG. 7, which is below the lasing threshold and therefore contains the emission peak at 364 nm. However, above the lasing threshold in FIG. 9, the emission at 404 nm is orders of magnitude higher than the emission at 364 nm, and the output is highly directional, as shown in FIG. 8.

Ring pumping is expected to be more effective at initiating laser action, because it has a more efficient overlap with the high gain region of the whispering gallery modes. At the highest input pump power of 2.17 kW, the 404 nanometer peak (with a full-width half-maximum FWHM of 5 nanometers) for ring pumping is nearly an order of magnitude greater than that for flood pumping (with a FWHM of 15 nanometers) and the amplified spontaneous emission (ASE) threshold was less than half that for flood pumping.

Figure 10:
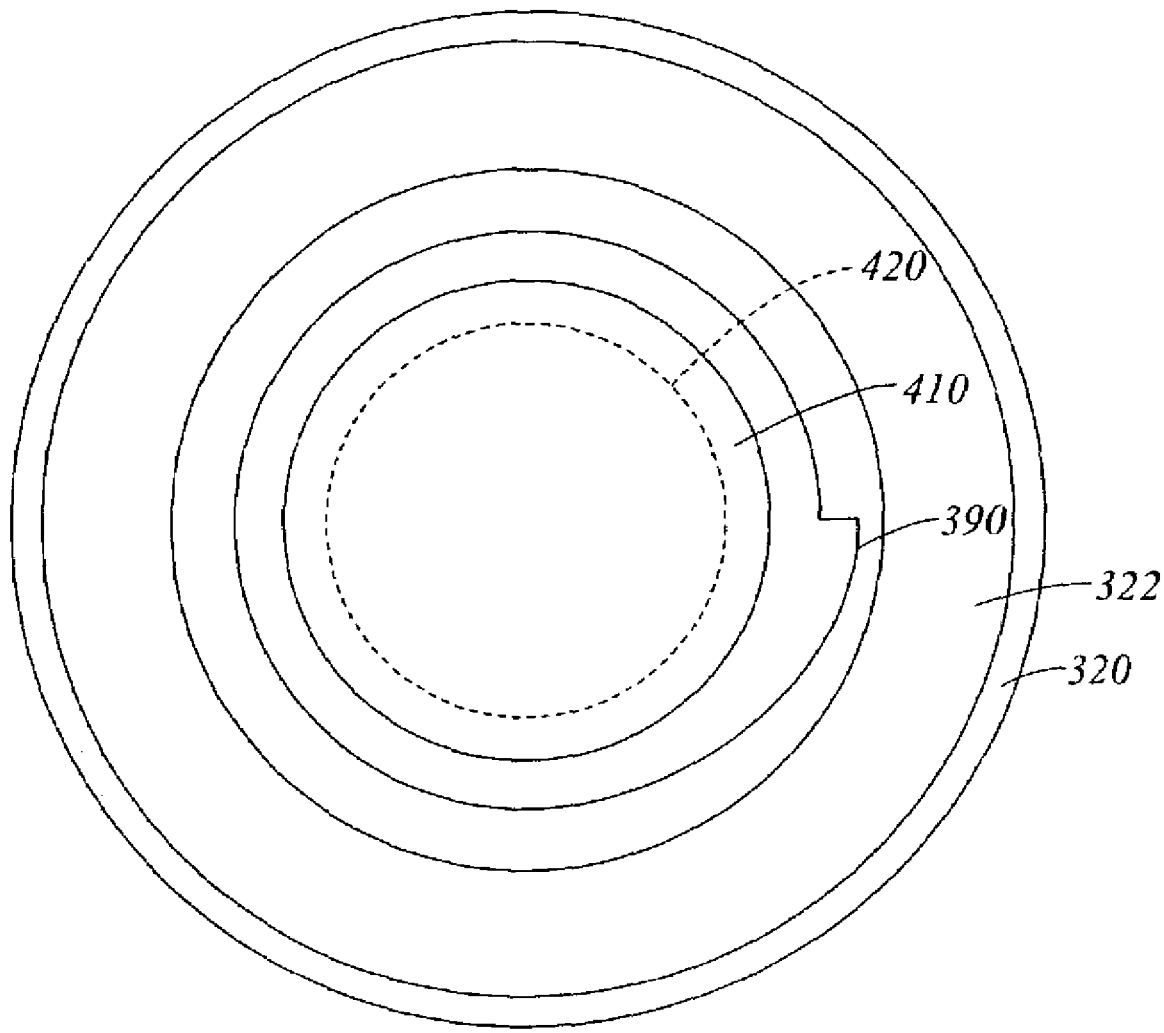
FIG. 10 is a top view of a first exemplary embodiment of a top electrode for the electrically pumped locally-outcoupled cavity resonator of FIG. 4 according to this invention.

Although the locally-outcoupled cavity resonator 100 has been shown to be capable of generating coherent radiation when pumped optically, for wider applicability, the lasing modes should be electrically excited. FIG. 10 is a simplified schematic top view of an electrically pumped locally-outcoupled cavity resonator 300. In particular, FIG. 10 shows the structure of the p-electrode 410, which sits on the top surface of the locally-outcoupled cavity resonator structure 390, and the n-electrode 322 which sits on a pedestal formed on the n-type (Al)(In)GaN current spreading layer 320, which covers the substrate 310. In various exemplary embodiments, the p-electrode comprises a layer of palladium 410 formed over and around an insulating disk of $SiO_2$ 420, to form a concentric contact ring 400, which overlaps the high gain region near the perimeter of the spiral locally-outcoupled cavity resonator 300.

Figure 11:
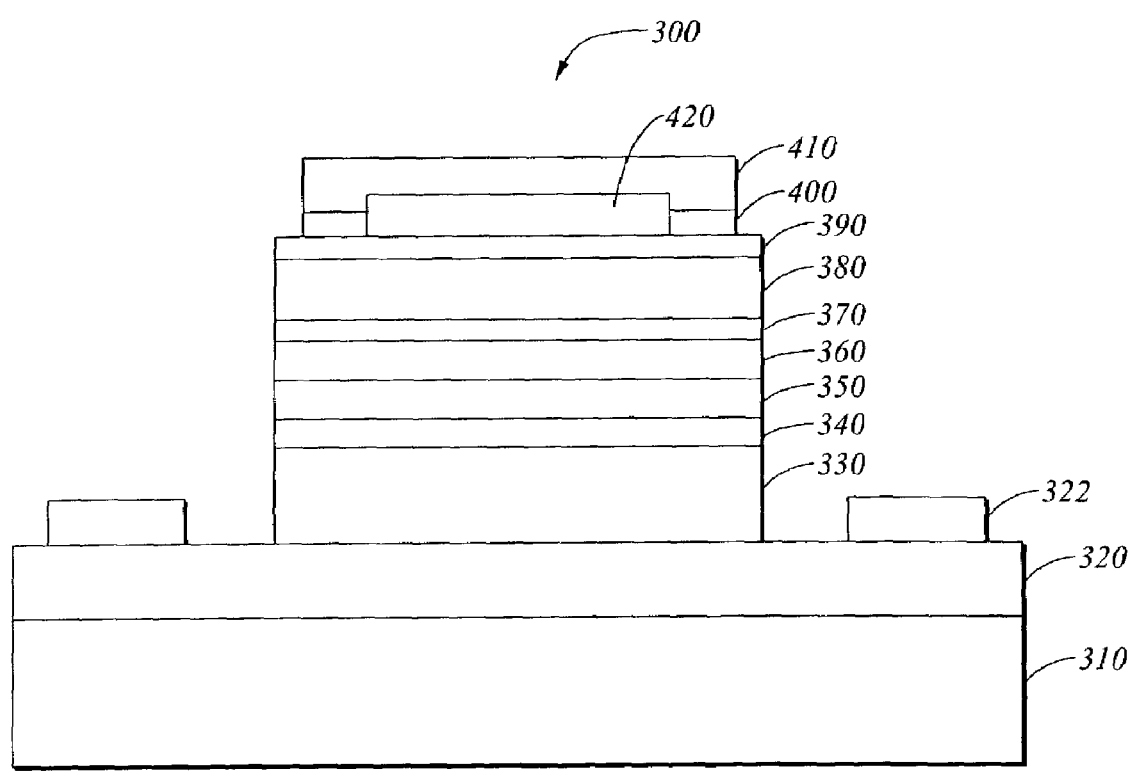
FIG. 11 is a cross-sectional view of one exemplary embodiment of the layer structure of the locally-outcoupled cavity resonator including the top electrode structure shown in FIG. 10.

FIG. 11 shows the layer structure of the locally-outcoupled cavity resonator 300 with the palladium contact ring p-electrode 400 lying on top of the p-gallium nitride layer 390. The contact ring 400 is defined by the silicon dioxide insulating layer 420, which insulates the center of the p-electrode 410 from the underlying semiconductor p-doped gallium nitride layer 390. Therefore, the electrode contact is formed as a concentric ring 400 surrounding the silicon dioxide layer 420 and providing contact to the underlying p-doped gallium nitride layer 390.

In various exemplary embodiments, the electrically pumped locally-outcoupled cavity resonator 300 shown in FIG. 11 is formed as outlined above for the optically pumped locally-outcoupled cavity resonator 100. Then, after growing the heterostructures using metal-organic chemical vapor deposition (MOCVD), the magnesium doping is activated by rapid thermal annealing. Next, an ohmic p-metal contact film layer is formed on or over the nitride layer 390 and the insulating layer 420 to form the contact ring p-electrode 400. In various exemplary embodiments, the contact film layer can be formed using nickel (Ni), palladium (Pd), platinum (Pt) a nickel-gold alloy Ni/Au, a palladium/titanium/gold alloy Pd/Ti/Au, or a platinum/titanium/gold alloy Pt/Ti/Au by thermal or e-beam evaporation. The p-metal contacts may then be annealed.

A ring-ridge waveguide structure may be formed next by chemically assisted ion beam etching the AlGaN:Mg cladding layer 270 and into the p-GaN waveguide layer 260. This can provide for improved lateral optical waveguiding. This step can be combined with the formation of the p-metal contact film layer.

The outer shape of the spiral locally-outcoupled cavity resonator is then formed by chemically assisted ion beam etching to form the structure 390. A hole may be formed in this step, to remove the central part of the laser resonator structure. This tends to prevent excitation of modes with trajectories going through the center of the disk. The n-metal ring contact 322 is then deposited by thermal or e-beam evaporation and annealed. The n-metal contact may be an alloy of titanium/aluminum (Ti/Al), titanium/gold (Ti/Au), or titanium/aluminum/platinum/gold (Ti/Al/Pt/Au).

A dielectric isolation layer 420 (e.g., $SiO_2$, $Si_3N_4$, SiON, polyimide) can be deposited next by physical evaporation chemical vapor deposition (PECVD) e-beam or sputter processing (except for polyimide). An opening in the dielectric layer 420 for p-metal and n-metal pads may be made by plasma etching, for example using $CF_4$. The dielectric isolation layer can remain on the side walls of the locally-outcoupled cavity resonator in order to reduce the refractive index step between the nitride heterostructures and air and also to further smoothen the side wall surface.

The n-metal pads 322 and p-metal pads 410 are then deposited by thermal or e-beam evaporation. The pads may be alloys of titanium/gold (Ti/Au) or titanium/platinum/gold (Ti/Pt/Au), for example. The side walls may be coated with a metal (e.g., Al) or dielectric (e.g., $SiO_2/Ta_2O_5$) by thermal or e-beam evaporation. In the case of a metal coating, the side walls should be covered with a dielectric insulation layer.

Figure 12:
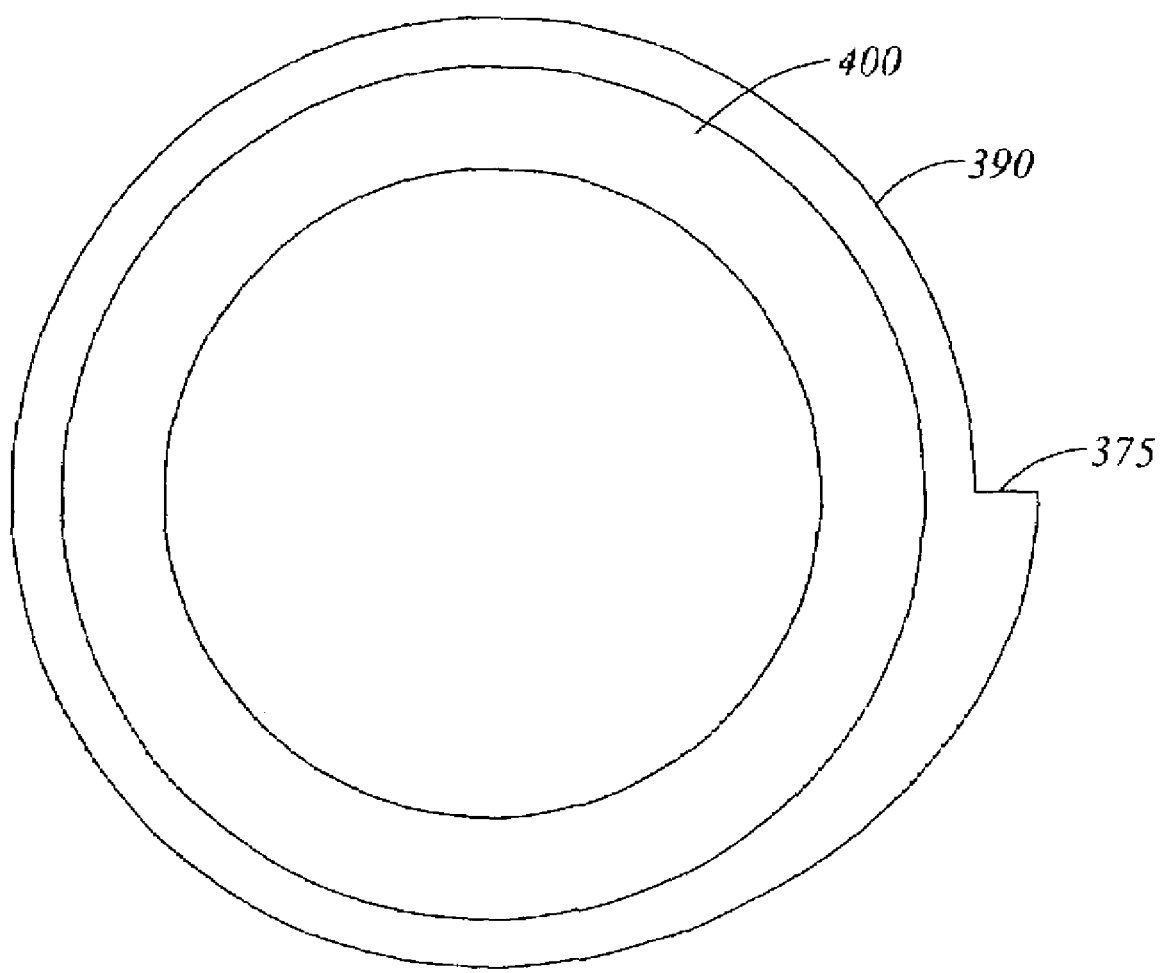
FIG. 12 is a top view of a second exemplary embodiment of the top electrode structure.
Figure 13:
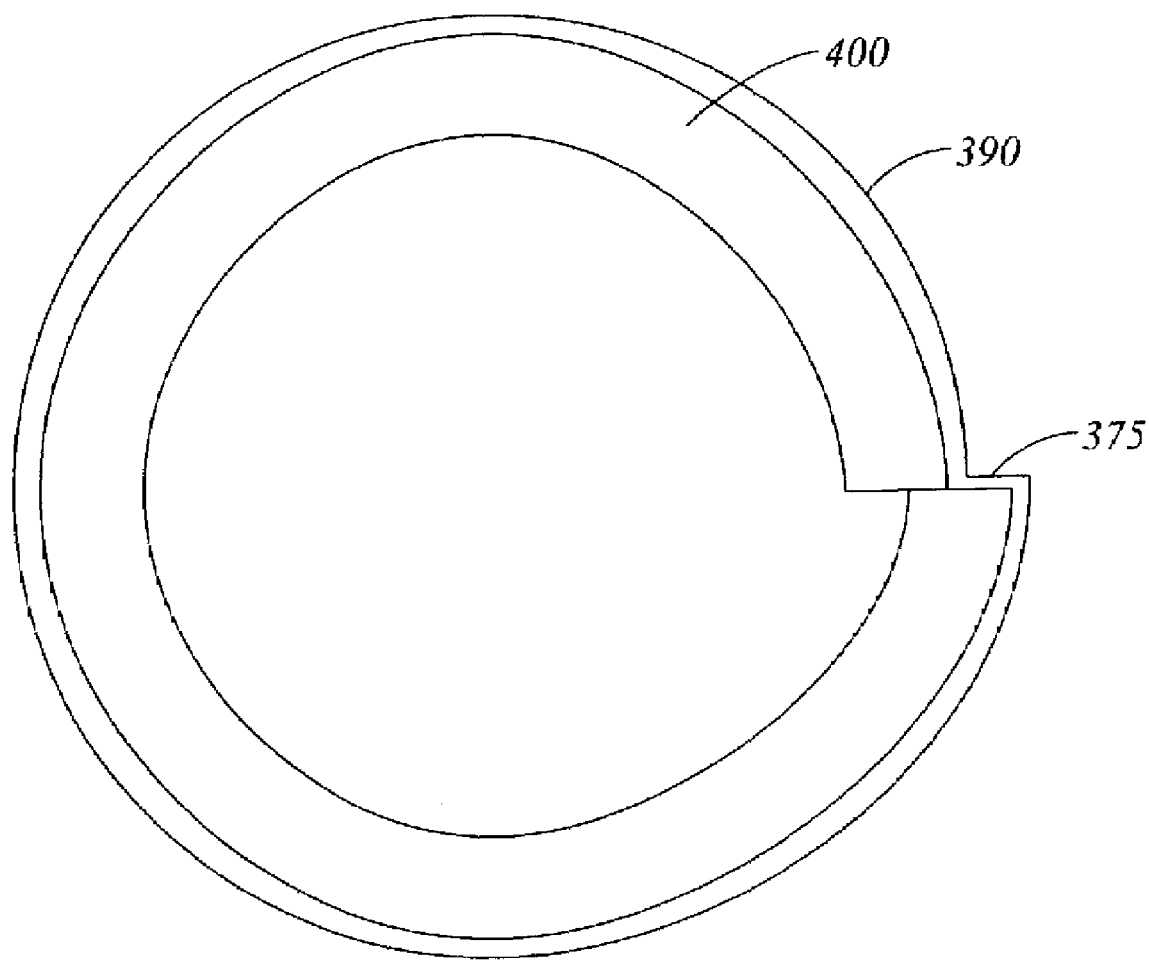
FIG. 13 is a top view of a third exemplary embodiment of the top electrode structure.
Figure 14:
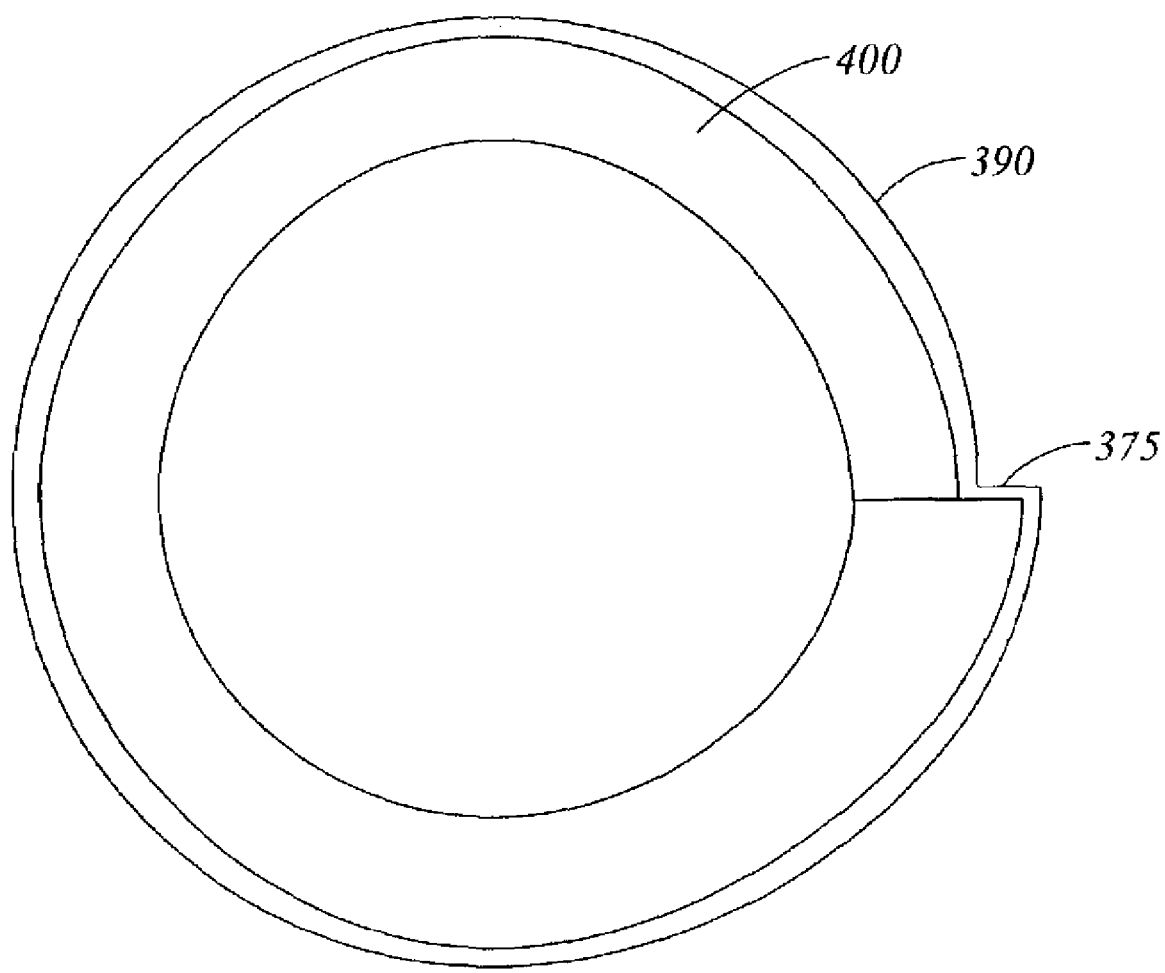
FIG. 14 is a top view of a fourth exemplary embodiment of the top electrode structure.

A number of options exist for the design of the contact ring p-electrode 400 that can improve the efficiency of the pumping of the high gain region around the periphery of the locally-outcoupled cavity resonator 300. FIG. 12 shows a first exemplary embodiment, which is a simple concentric ring 400 of p-electrode material centered on the center of the spiral shape 390. FIG. 13 shows a second exemplary embodiment of the contact ring 400, where the radius of the p-electrode 400 extends in a spiral shape and more closely follows the outer diameter of the spiral 390. FIG. 14 shows a third exemplary embodiment of the contact ring 400, in which the inner radius of the p-electrode 400 is a simple concentric ring, but the outer radius follows the spiral boundary. In this third exemplary embodiment, the width of the p-electrode 400 therefore increases as it approaches the output aperture 375.

Table 1 summarizes the results of current pumping a variety of spiral laser structures of different sizes using different p-electrode designs. According to Table 1, the lowest threshold current densities are achieved with the third exemplary embodiment of contact ring p-electrode 400 shown in FIG. 14, as would be expected based on the geometry of the spiral and the locations of the lasing modes. For the locally-outcoupled cavity resonator 300 using this third exemplary embodiment of the contact ring p-electrode 400, a minimum current density threshold of 4.6 kA per square centimeter is shown to be the onset of lasing action. In comparison, the second exemplary embodiment of the p-electrode 400 shown in FIG. 13 results in a minimum threshold current density of 6.5 kA per square centimeter for the locally-outcoupled cavity resonator 300, while the first exemplary embodiment of the p-electrode 400 shown in FIG. 12 results in a minimum threshold current density of 7.2 kA per square centimeter for the locally-outcoupled cavity resonator 300.

TABLE 1

| Size | Spiral shape | p-electrode configurations | Threshold current density |
|---|---|---|---|
| D = 700 μm | $\epsilon = 0.1$ | FIG. 12 | 7.2 kA/cm$^2$ |
| D = 700 μm | $\epsilon = 0.1$ | FIG. 13 | 6.5 kA/cm$^2$ |
| D = 700 μm | $\epsilon = 0.1$ | FIG. 14 | 4.6 kA/cm$^2$ |
| D = 700 μm | $\epsilon = 0.05$ | FIG. 14 | 4.6 kA/cm$^2$ |
| D = 500 μm | $\epsilon = 0.05$ | FIG. 14 | 7.3 kA/cm$^2$ |
| D = 300 μm | $\epsilon = 0.05$ | FIG. 14 | 10.6 kA/cm$^2$ |

Figure 15:
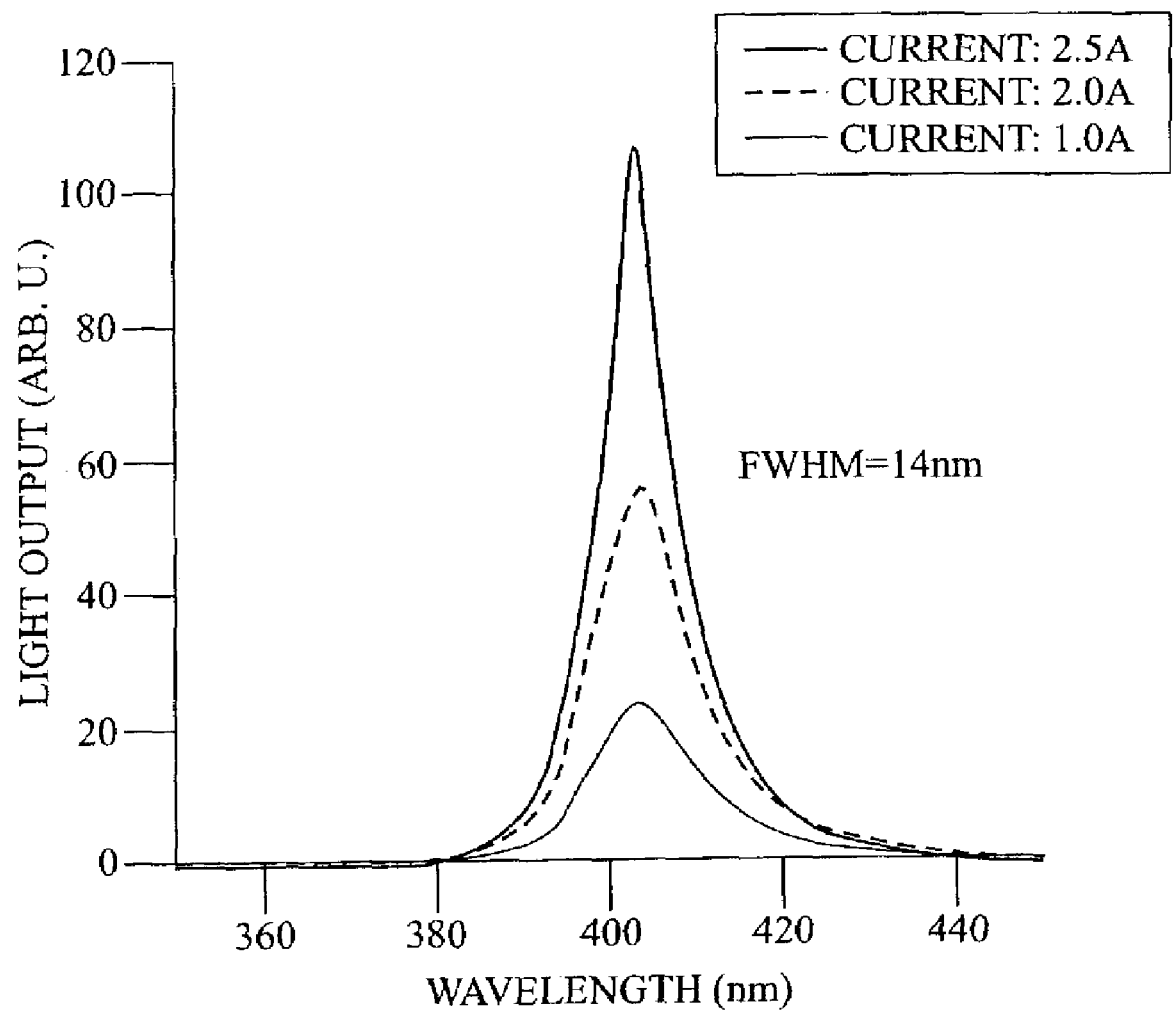
FIG. 15 shows the light output intensity from the output aperture of the locally-outcoupled cavity resonator of FIG. 4, when electrically pumped below the lasing threshold.
Figure 16:
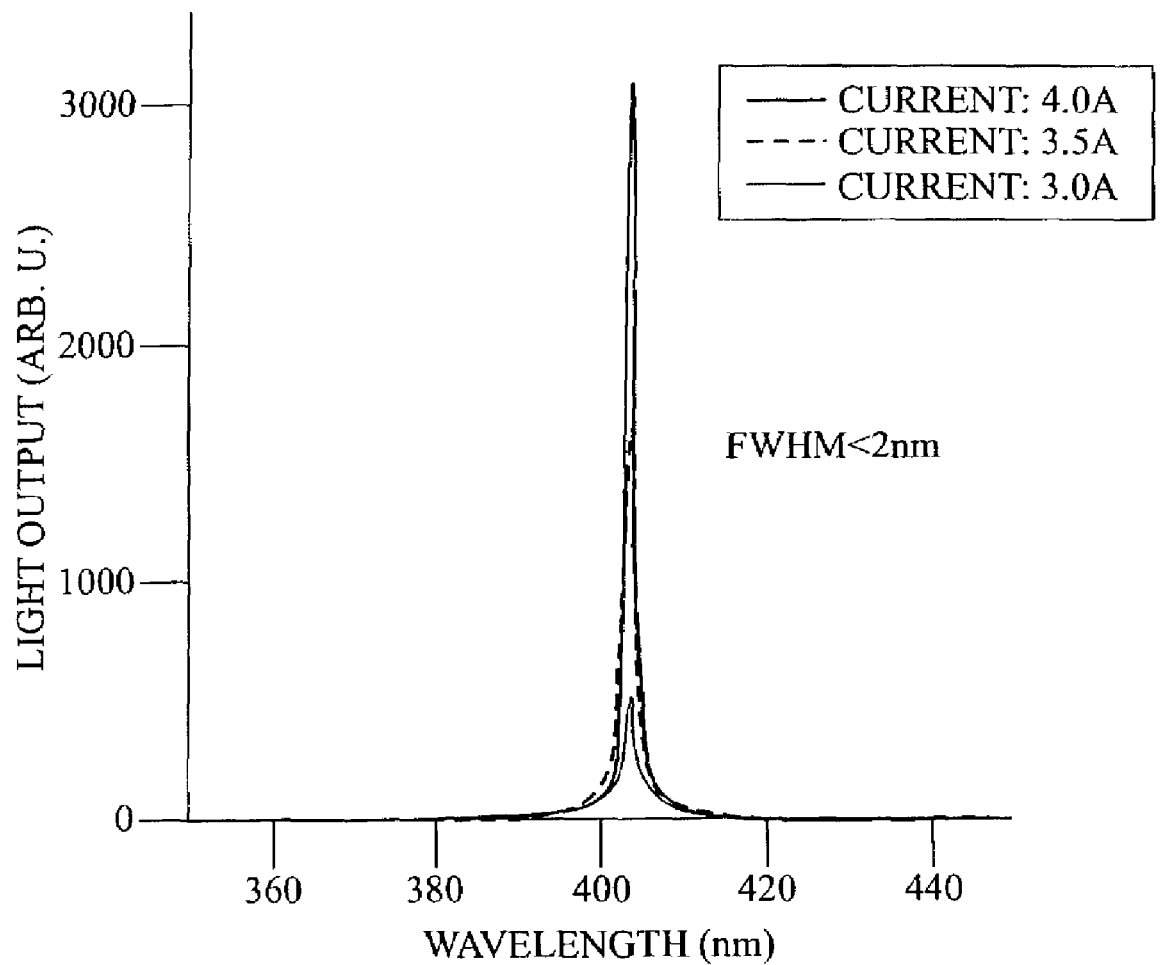
FIG. 16 shows the light output intensity from the output aperture of the locally-outcoupled cavity resonator of FIG. 4, when electrically pumped above the lasing threshold.

FIG. 15 shows the light output from the spiral locally-outcoupled cavity resonator when current is injected below the threshold current density for lasing. There is a relatively broad full-width, half-maximum (FWHM) peak of 14 nanometers centered at 404 nanometers with an injected current of 1 A, 2 A and 2.5 A. FIG. 16 shows the onset of laser action, where the current is raised above the threshold of 3.5 A and a large increase in light output is demonstrated with a narrowing of the peak to a full-width, half-maximum peak of less than 2 nanometers. These results were obtained with a p-electrode design of the type shown in FIG. 14.

As can be seen from the results shown in Table 1, FIG. 15 and FIG. 16, and from the results of the optical pumping experiments shown in FIGS. 6–9, the most efficient use of pump energy is attained when the pump input is applied to the outer regions of the device, because the outer regions are predominantly where the high gain whispering gallery modes exist.

Figure 17:
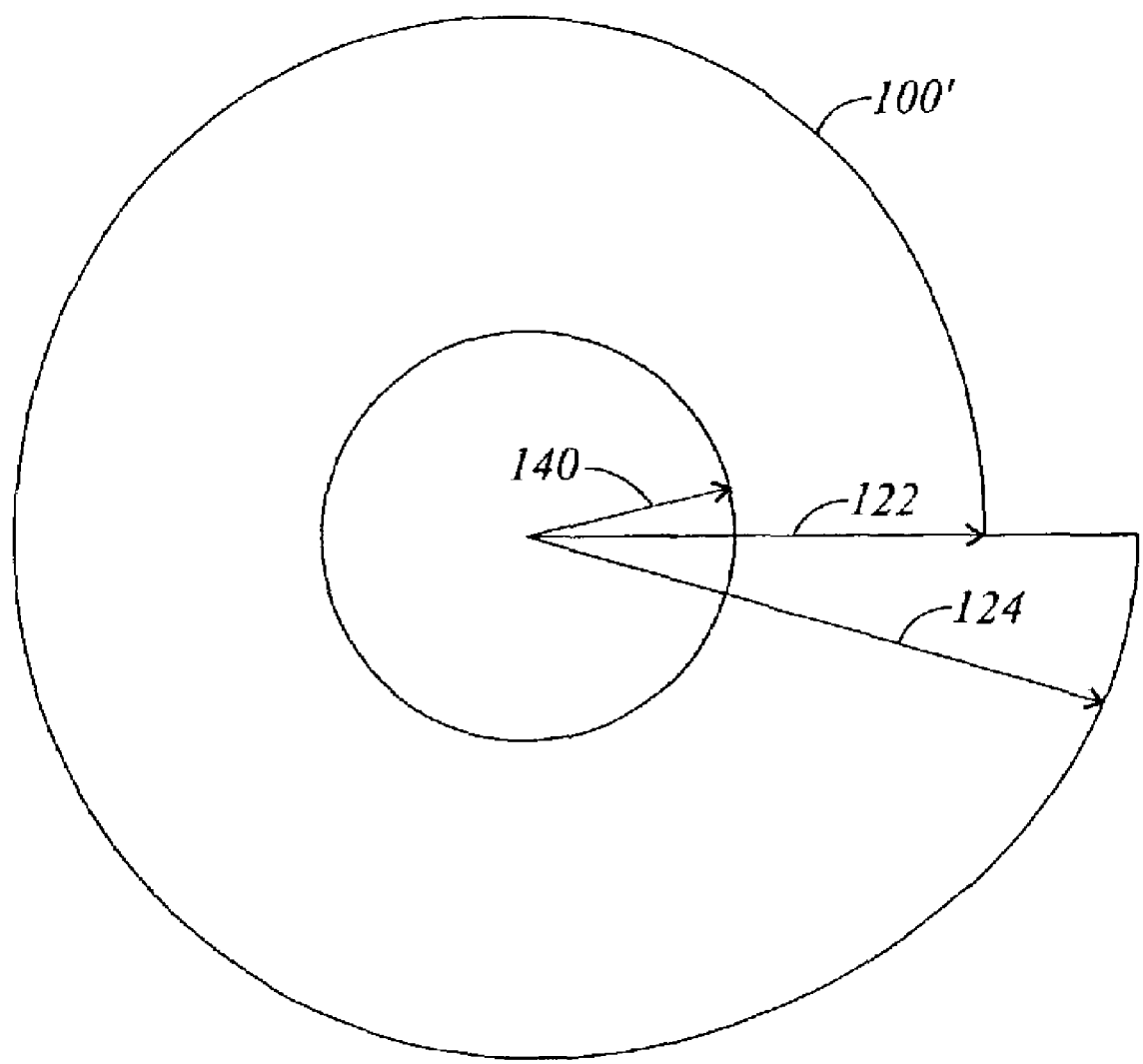
FIG. 17 shows a second exemplary embodiment of the shape of the locally-outcoupled cavity resonator according to this invention, where a central portion of the disk has been removed.

A similar improvement in efficiency can be realized by simply removing the central portion of the spiral device. FIG. 17 shows a second exemplary embodiment of a locally-outcoupled cavity resonator 100', where an interior portion having a radius 140 has been removed. The spiral locally-outcoupled cavity resonator 100' therefore no longer provides gain along a path traversing the central portion of the spiral locally-outcoupled cavity resonator, so that population inversion losses are reduced by eliminating the modes which traverse the center of the spiral locally-outcoupled cavity resonator 100', and exit the device at areas other than at the output aperture 126.

Figure 18:
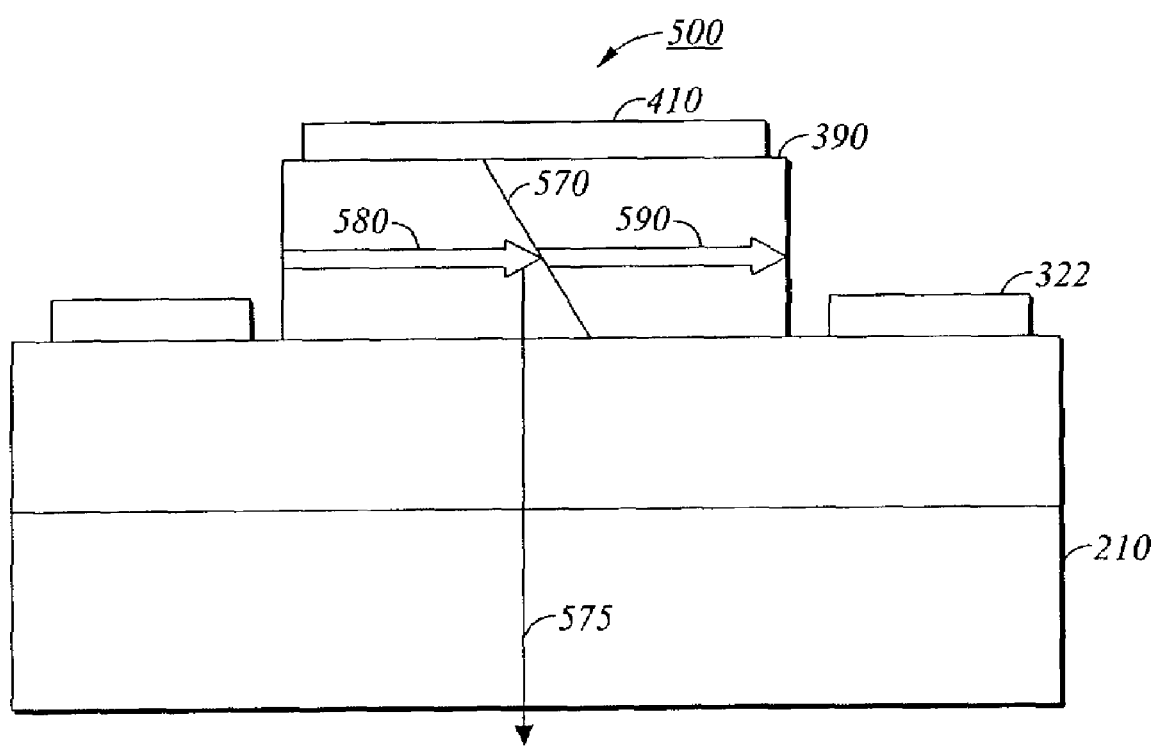
FIG. 18 shows a third exemplary embodiment of the shape of the locally-outcoupled cavity resonator according to this invention.

FIG. 18 shows a third exemplary embodiment of an locally-outcoupled cavity resonator 500 in which the window of an output aperture 570 is forward-tilted at a 45° angle with respect to the face of the device 390. Light propagating in from the left, 580, to the right 590, must cross the tilted output window 570, which redirects a portion of the light 575 vertically through the bottom substrate 210. Therefore, as a variation of a vertical sidewall spiral structure, one may also form a tilted output aperture window, in order to provide out-coupling of the whispering gallery modes into directions out of the plane of the disk and even perpendicular to the surface. The tilted surface can be formed by tilting the substrate at an angle relative to the directional etching beam. Alternatively, wet chemical etching may naturally form an angled surface.

Figure 19:
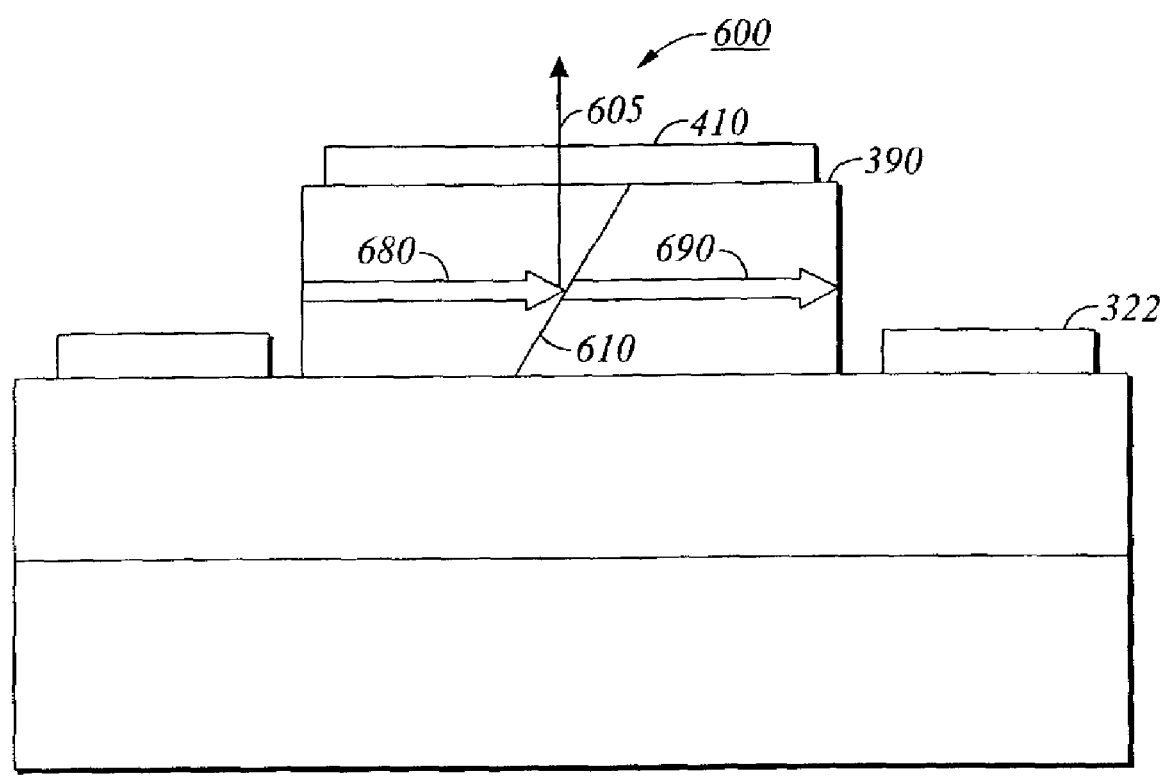
FIG. 19 shows a fourth embodiment of the shape of the locally-outcoupled cavity resonator according to this invention.

FIG. 19 shows a fourth exemplary embodiment 600, which is similar to the third exemplary embodiment 500. However, in this fourth exemplary embodiment 600, the output aperture 610 is backward-tilted 45° in the opposite direction such that light propagating from the left 680 to the right 690 is emitted in a beam 605 through the top surface 410 of the locally-outcoupled cavity resonator 600 to emit vertically, similarly to a vertical cavity surface emitting laser VCSEL.

Figure 20:
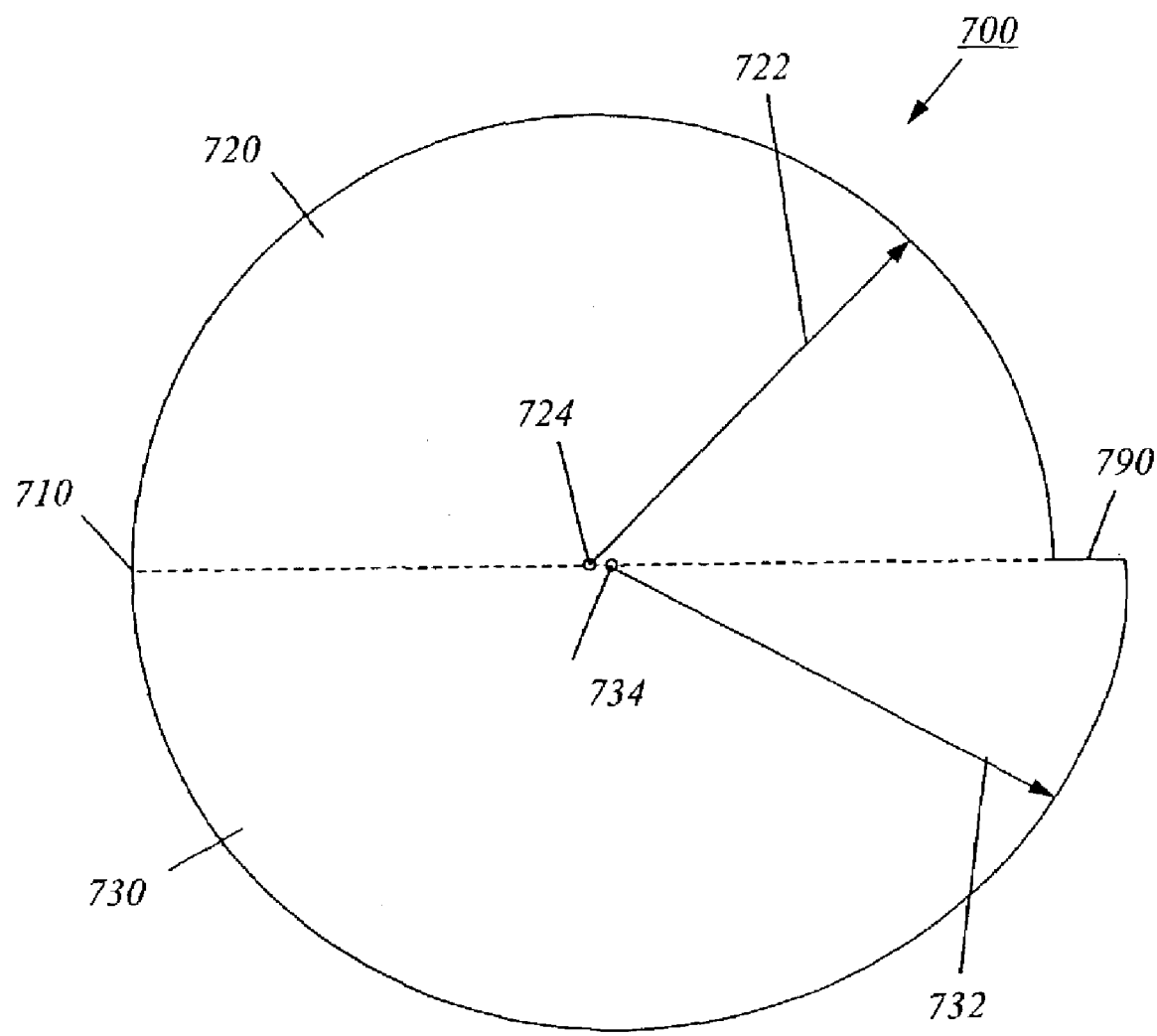
FIG. 20 shows a fifth exemplary embodiment of the shape of the locally-outcoupled cavity resonator, according to this invention.

FIG. 20 shows a fifth exemplary embodiment 700 of a locally-outcoupled cavity resonator that provides uni-directional output. As shown in FIG. 20, the locally-outcoupled cavity resonator 700 is formed by two dissimilar half circle cross-sectional portions 720 and 730, with the side walls of the two semicircular portions aligned at one edge 710. The output aperture 790 is formed at the discontinuity between the radii 732 and 722 of the larger and smaller semicircular portions 730 and 720. Because the side walls of the locally-outcoupled cavity resonator 700 must match at the left edge 710, the centers 734 and 724 of the semicircles 730 and 720 are not collocated, but instead are offset from one another. Many of the properties of the locally-outcoupled cavity resonator 700 are similar to those of the spiral-shaped locally-outcoupled cavity resonator 100–600 including the existence of the notch or output aperture that lifts the degeneracy of the counter propagating modes. However, it should be appreciated that the far field angular distribution of the unidirectional emission may be different from that for the spiral-shaped locally-outcoupled cavity resonator 100–600.

It should be appreciated that the terms "semicircles" and "semicircular portions," as used herein, encompasses two or more arcuate portions that can have angular extents other than 180° (or $\pi$), so long as the total angular extent is 360° (or $2\pi$). Thus, one "semicircular portion" can have an extent of 270° (or $3\pi/2$), while the other has an extent of 90° (or $\pi/2$). Similarly, three "semicircular portions," each having a different radius, can have various extents that add up to 360° (or $2\pi$), such as, for example, three portions having extents of 120° (or $\pi/3$) each.

Figure 21:
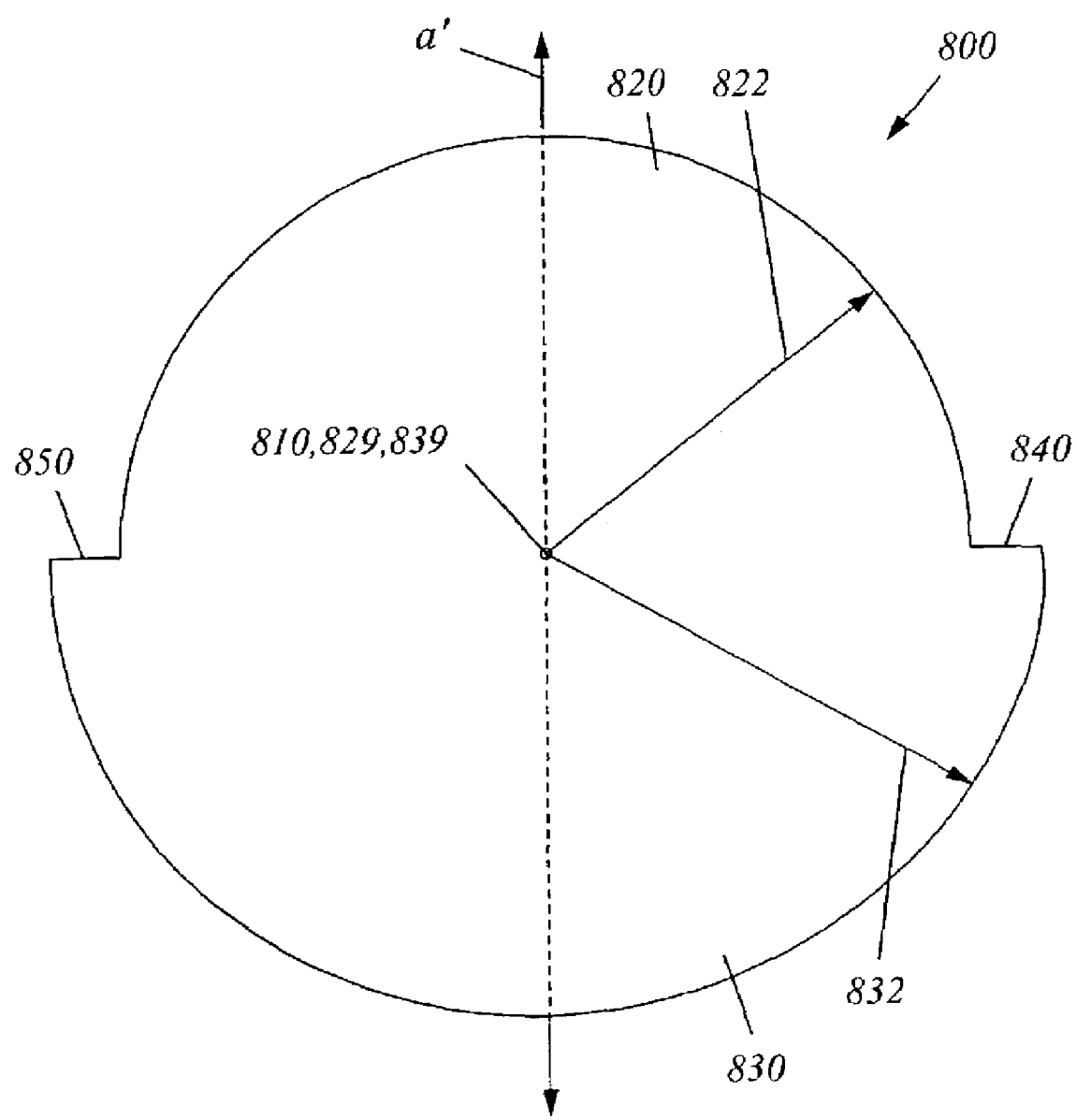
FIG. 21 shows a sixth exemplary embodiment of the shape of the locally-outcoupled cavity resonator, according to this invention, wherein the semicircles are concentric.

FIG. 21 shows a sixth exemplary embodiment of the locally-outcoupled cavity resonator 800, which is generally similar to the locally-outcoupled cavity resonator 700 shown in FIG. 20. The centers of the two semicircles 829 and 839 are collocated at point 810. As a result, the semicircles do not have side walls that are flush with one another on one side, as was the case in the fifth exemplary locally-outcoupled cavity resonator 700 shown in FIG. 20. The first semicircle 820 has a radius 822, while the second semicircle 830 has a larger radius 832. Because the centers of the semicircles are collocated at the point 810, two output apertures 840 and 850 are formed, one on the left side and the other on the right side. One aperture 840 can serve as an input point for a light signal. The other aperture 850 can serve as an output point. This locally-outcoupled cavity resonator 800 will have higher losses and therefore lower Q than the embodiments shown in FIGS. 4 and 20.

It should also be appreciated that the locally-outcoupled cavity resonator 800 is asymmetric according to this invention, even though it is not truly asymmetrically shaped. That is, there is a line a' of symmetry in the 800. However, the locally-outcoupled cavity resonator 800 nevertheless interacts asymmetrically with the various clockwise and counterclockwise circulating modes. That is, like all of the previously described embodiments, the locally-outcoupled cavity resonator 800, at each of the apertures 840 and 850, asymmetrically interacts with the clockwise and counterclockwise modes. That is, each aperture 840 and 850 interacts with the counterclockwise modes differently than that aperture 840 or 850 interacts with the clockwise modes.

Figure 22:
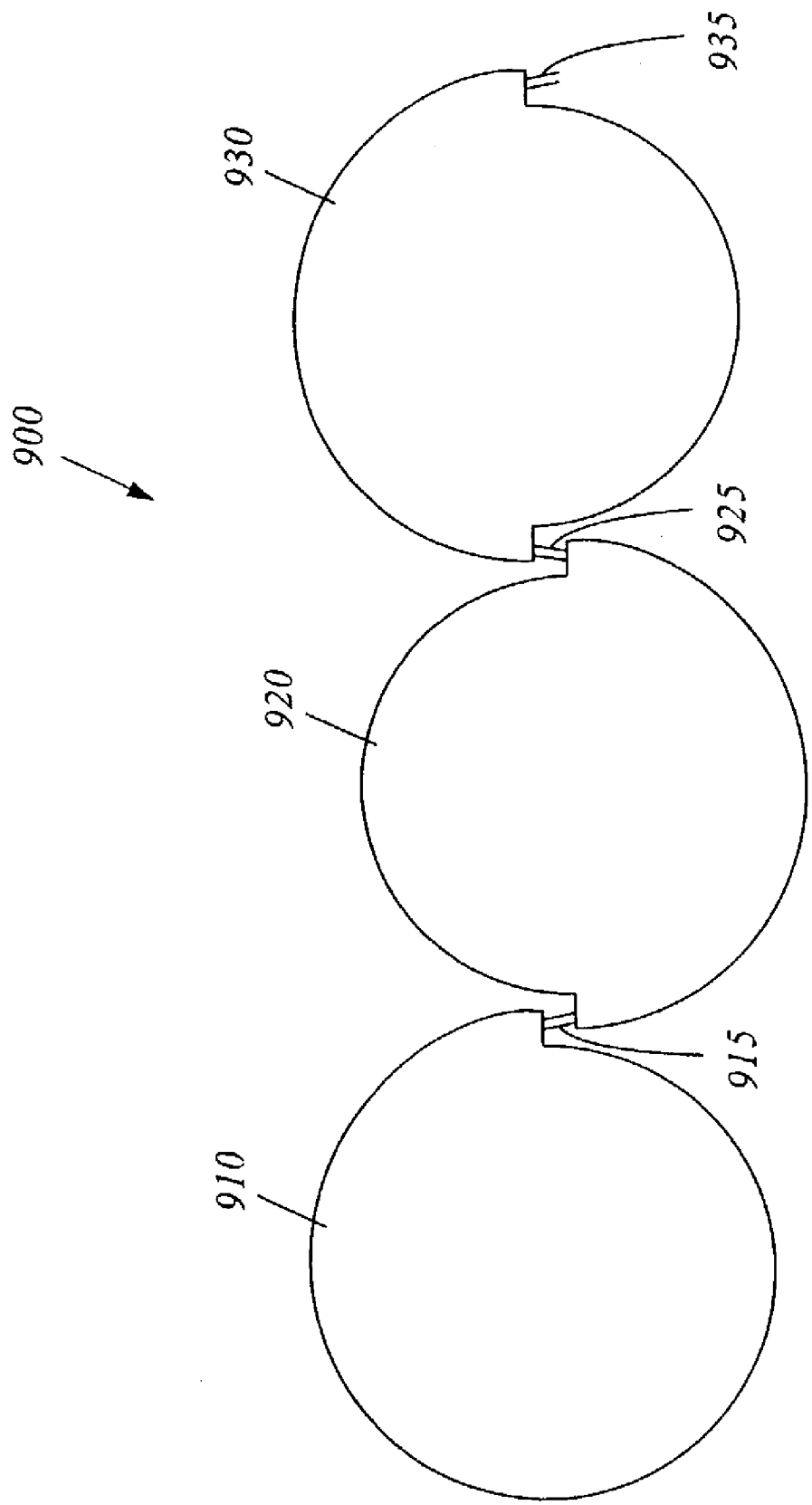
FIG. 22 shows one exemplary embodiment of an optical amplifier chain, using the first and sixth exemplary shape embodiments of the locally-outcoupled cavity resonator according to this invention.

It should also be appreciated that the locally-outcoupled cavity resonator 800 can function as an amplifier. Using a plurality of such semicircular devices, a cascaded amplifier chain 900 can be constructed, such as that shown in FIG. 22. FIG. 22 shows the output 915 of a single spiral laser 910 being coupled into a first amplifier 920, which outputs the amplified signal 925. The amplified signal 925 is then input into a second amplifier 930 to further amplify the signal until it is output as the amplified output signal 935.

Because the locally-outcoupled cavity resonators according to this invention can be coupled through propagating waves and not by evanescent waves, the distance between two locally-outcoupled cavity resonators can be several microns, and up to several millimeters, instead of only sub-microns, as would be the case with evanescent wave coupling. Therefore, in the amplifier chain shown in FIG. 22, the locally-outcoupled optical amplifier 920 may be located several microns, and may be located up to millimeters, from the locally-outcoupled cavity resonator 910. Similarly, a locally-outcoupled optical amplifier 930 can be located several microns, and up to several millimeters, from the locally-outcoupled optical amplifier 920 in order to generate the amplified output signal 935 at the output of locally-outcoupled optical amplifier 930.

The input and output regions of these devices 910–930 may also be coupled by fabricating a waveguide structure, indicated by the reference numerals 915, 925 and 935, between the devices 910–930 on the surface of the substrate. This feature should substantially ease integration issues associated with using the locally-outcoupled cavity resonators according to this invention, compared with the earlier circular and non-circular asymmetric resonant cavities, as filters and raman amplifiers in fiber-optic based telecommunications applications.

Figure 31:
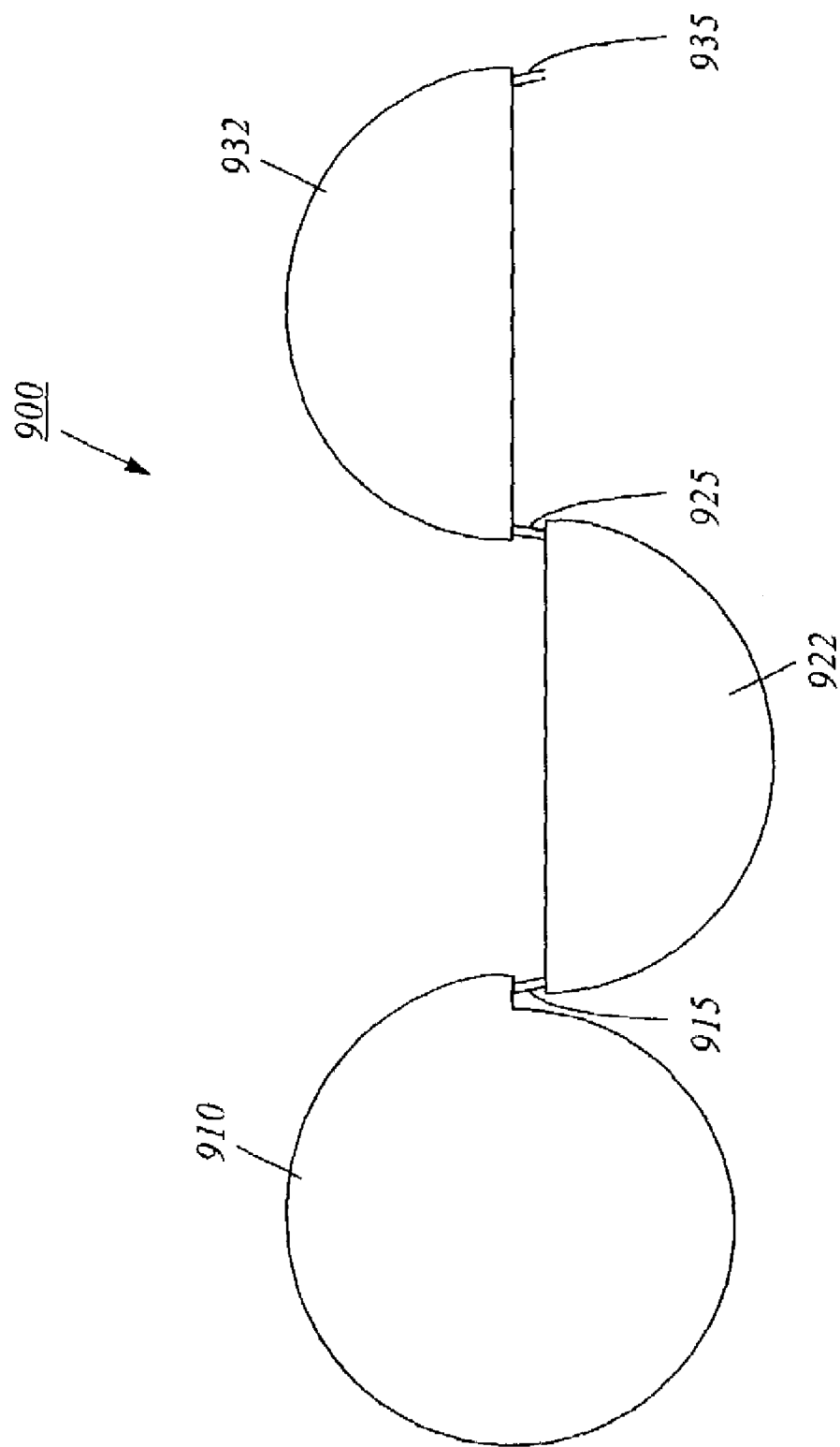
FIG. 31 shows an exemplary embodiment wherein the amplifier chain is made of half circles.

One alternative embodiment of the amplifier chain shown in FIG. 22 is shown in FIG. 31. In this exemplary embodiment, the semicircular portion which does not contribute to the amplification is removed, leaving only the bottom half 922 and the top half 932 in the amplifier chain. One result of removing the non-contributory portions of the locally-outcoupled cavity resonator is that the remaining semicircles can be placed closer together. An overlap of 5–10% of the length of the diameter of the semicircle is anticipated to achieve a compromise between launching the optical signal into portions of the locally-outcoupled cavity resonator that have no gain, and missing the semicircle entirely with some of the optical signal.

Figure 32:
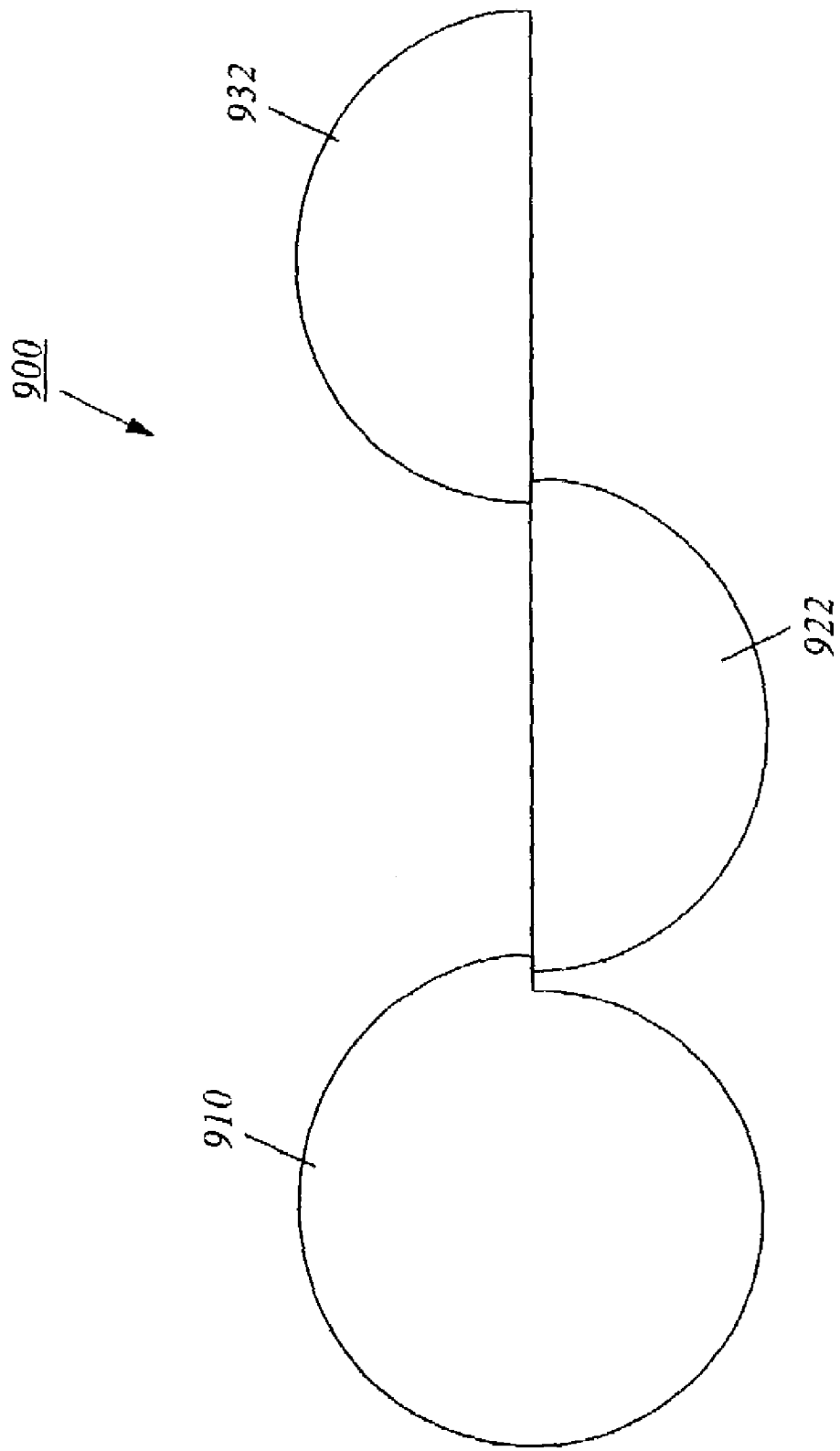
FIG. 32 shows an exemplary embodiment in which the half circles of the amplifier chain are in contact.

The gap between the semicircles can also be reduced or eliminated, as shown in FIG. 32. This would improve the coupling between the amplifier units in the amplifier chain, and eliminate the need for waveguides between the amplifier units.

It should be appreciated that the locally-outcoupled cavity resonator can be used to make frequency dependent bandpass filters, attenuators, modulators, converters and light-emitting diodes, as well as amplifiers, lasers and resonators.

Figure 23:
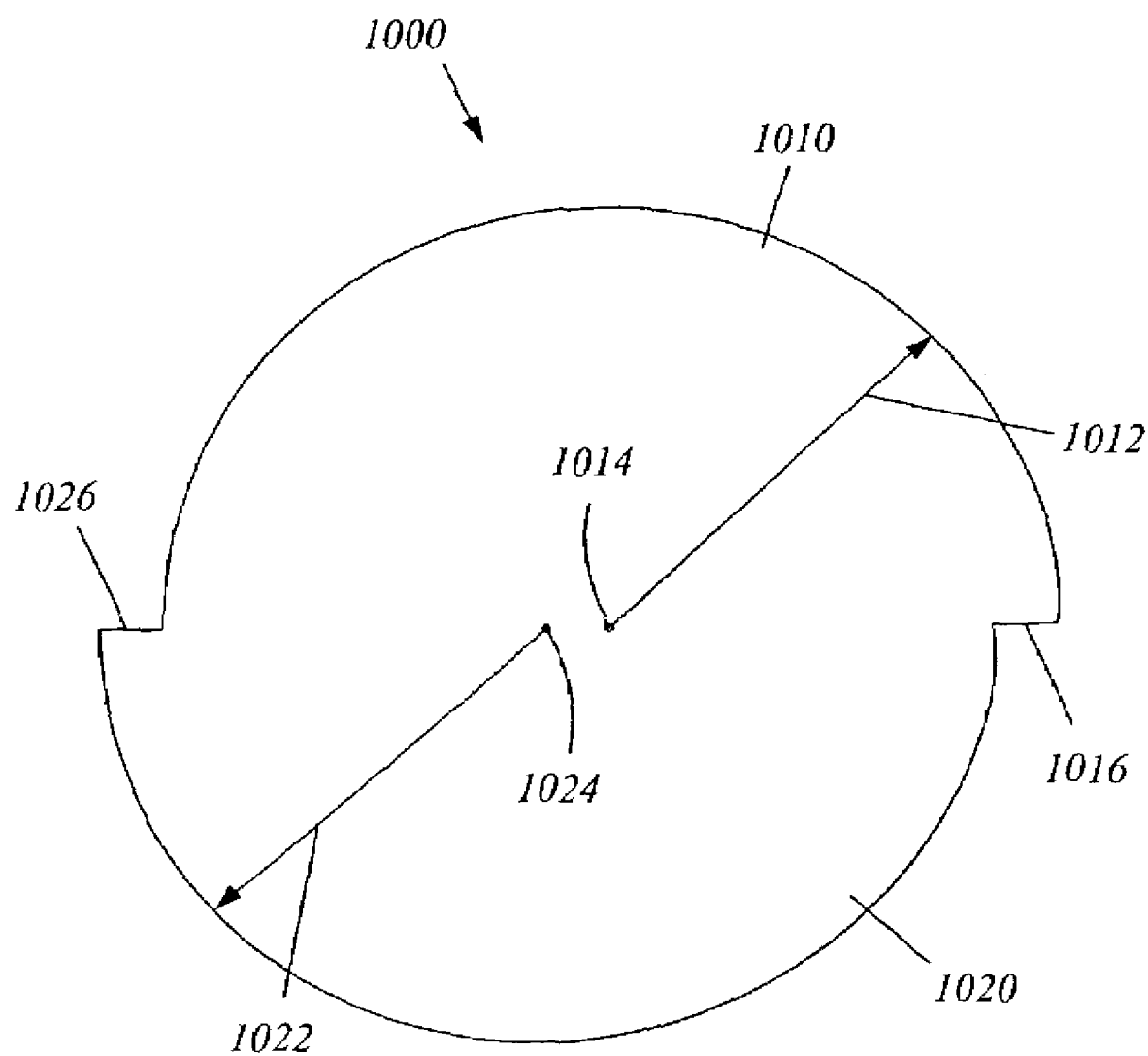
FIG. 23 shows a seventh exemplary embodiment of the shape of the locally-outcoupled cavity resonator, according to this invention, wherein the centers of the semicircles are not collocated.

FIG. 23 shows a seventh exemplary embodiment of a locally-outcoupled cavity resonator 1000. In this embodiment, the locally-outcoupled cavity resonator is formed of two semicircles 1012 and 1022 of the same or different radius. However, in this embodiment, the centers of the semicircles 1012 and 1022 are not collocated. Instead, one is located at a point 1024 and the other at a point 1014. As a result, two notches 1026 and 1016 are formed in the cross-section, with both notches 1026 and 1016 facing the same (clockwise or counterclockwise) direction with respect to the centers 1024 and 1014 of the semicircles.

Figure 24:
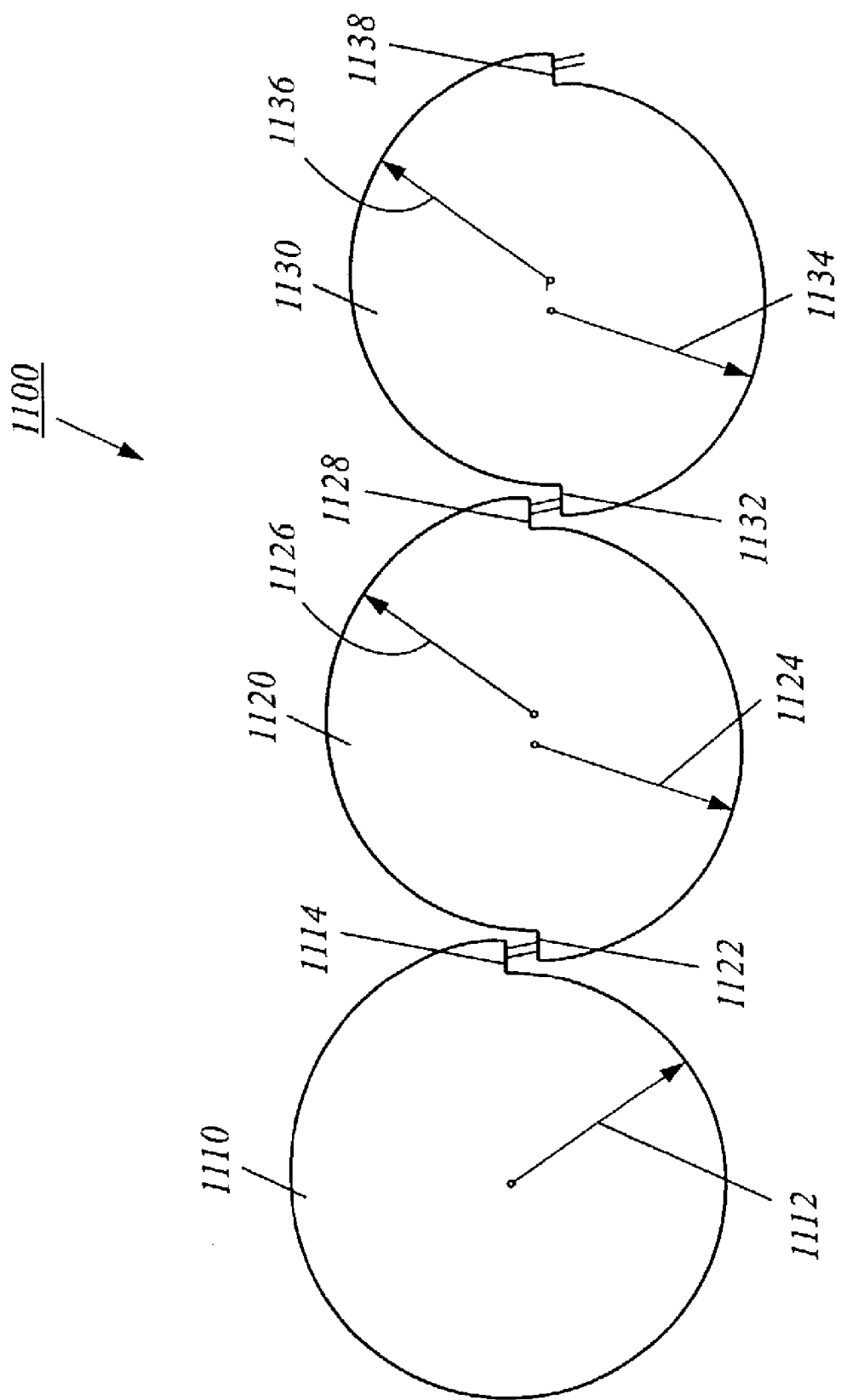
FIG. 24 shows one exemplary embodiment of an optical amplifier chain, using the first and seventh exemplary shape embodiments of the locally-outcoupled cavity resonator according to this invention, and wherein the components of the amplifier chain have different radii.

A plurality of the locally-outcoupled cavity resonators 1000 shown in FIG. 23 can be arranged in a cascaded amplifier chain similar to that shown in FIG. 22. This amplifier chain 1100 is shown in FIG. 24. However, in this embodiment, the amplifiers may each have a different radius of curvature. For example, the first element in the amplifier chain is the locally-outcoupled cavity resonator, which generates the input signal. The locally-outcoupled cavity resonator 1110 may have a radius of curvature of 1112 and output a signal at an output aperture 1114. The signal enters the input aperture 1122 of an amplifier 1120, which may have different radii of curvature 1126 and 1124 compared to the resonator 1110. The amplifier 1120 then outputs an amplified signal at an output aperture 1128 to an amplifier 1130. The amplifier 1130 may have yet other radii of curvature 1134 and 1136. By designing each optical element with a different radius of curvature, each optical element may have a different set of resonant frequencies, and provide mode selection for the amplified signal. An amplifier chain can thus be constructed where the amplified output is mode-selected from a multi-mode input.

Figure 25:
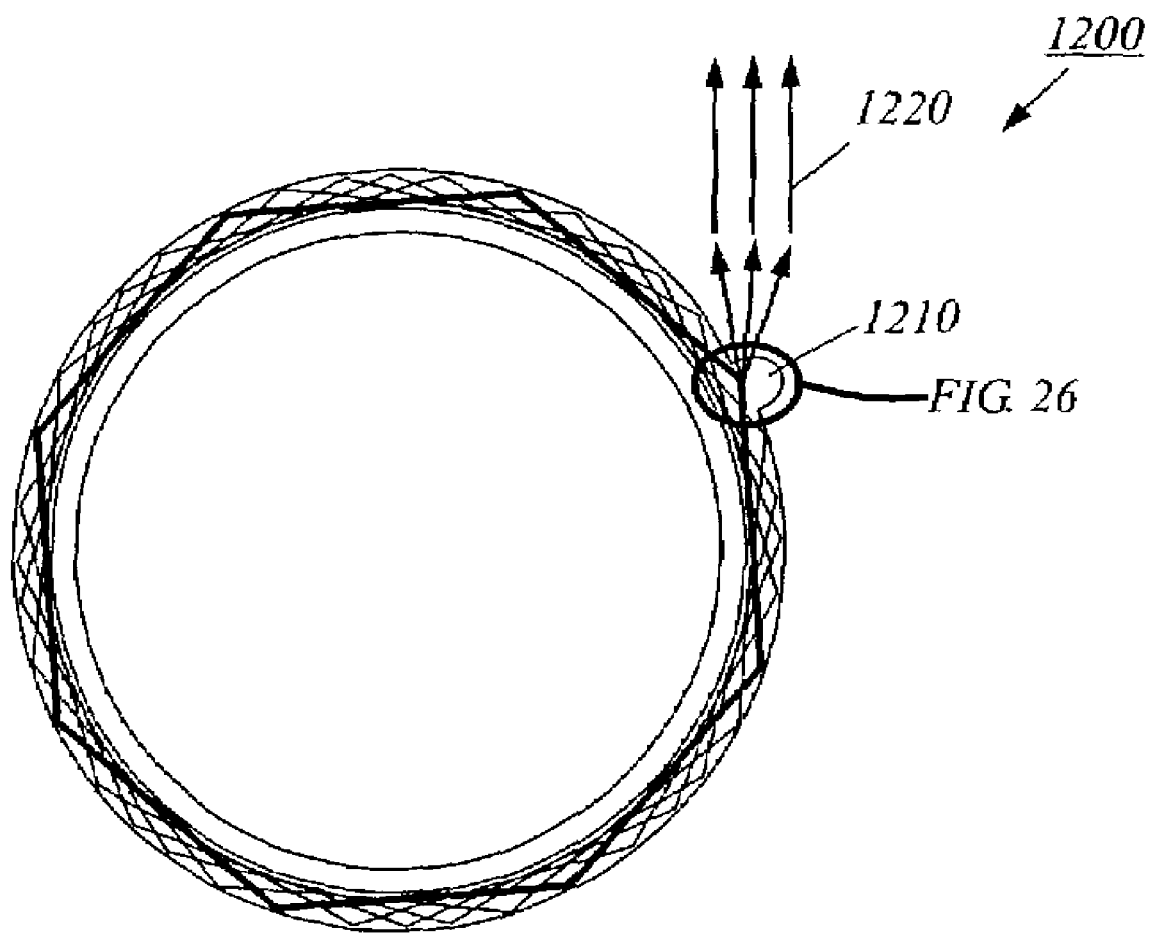
FIG. 25 shows an eighth exemplary embodiment of the shape of the locally-outcoupled cavity resonator according to this invention.

It should be appreciated that those of at least ordinary skill in the art may envision other geometries for cross-sectional shapes that break the clockwise and counterclockwise degeneracy based on the concepts disclosed herein. FIG. 25 shows an exemplary embodiment of a locally-outcoupled cavity resonator 1200 that is based on one such alternative geometry. As shown in FIG. 25, the locally-outcoupled cavity resonator 1200 is nearly fully circular, so that the clockwise and counterclockwise modes are nearly degenerate. It should be appreciated that the locally-outcoupled cavity resonator 1200 can use other closed shapes in which the whispering gallery modes can be sustained with low loss. However, the circularity and thus the symmetry of the structure are only weakly perturbed by the presence of a protrusion along the outer radius of an otherwise symmetric circumference. The protrusion is designed to be a non-intrusive and relatively weak perturbation on the symmetric system, so that scattering is minimal and pumping and modal purity are enhanced. As shown in FIG. 25, in various exemplary embodiments, a protrusion 1210 extending from the circumference outcouples light 1220 circulating in only one of the clockwise and counterclockwise directions. Leakage of that mode is thus introduced into the resonator 1200 by the protrusion 1210.

Figure 26:
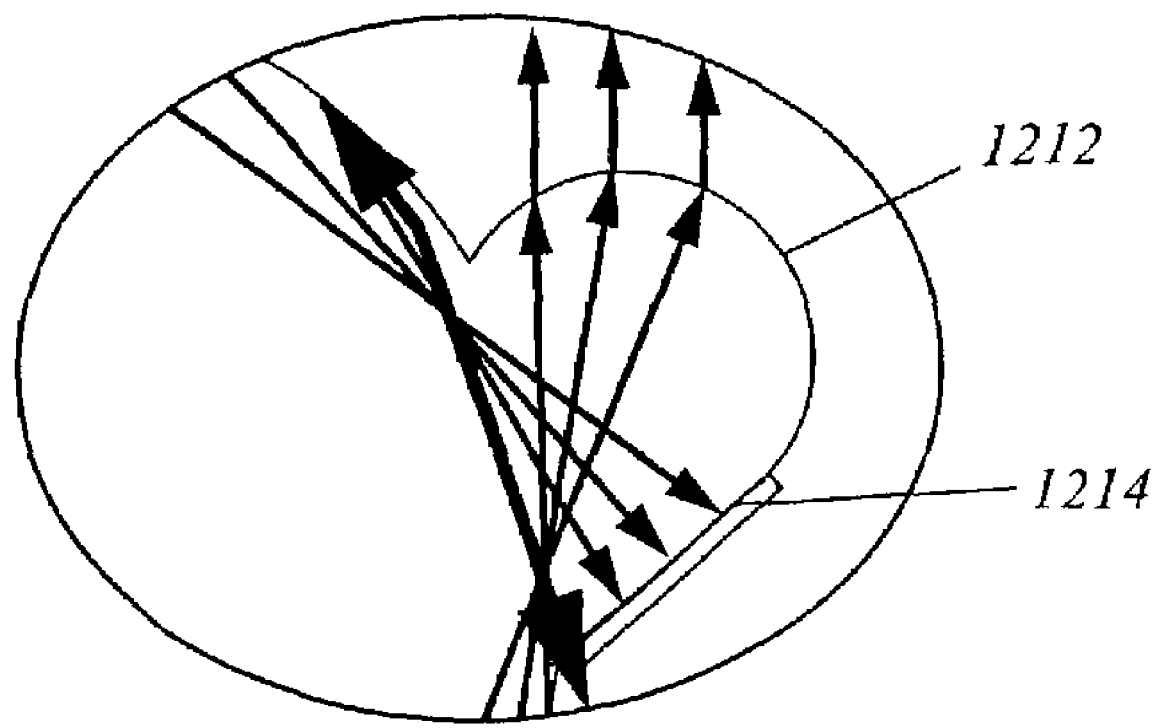
FIG. 26 shows the eighth exemplary shape embodiment of the locally-outcoupled cavity resonator according to this invention in greater detail.

As shown in greater detail in FIG. 26, one surface 1212 of the protrusion 1210 has a lenticular shape, which tends to collimate the outgoing light that is outcoupled by the protrusion 1210 from the counterclockwise mode. Another surface 1214 of the protrusion 1210 is reflective, and reflects the light circulating in the clockwise mode into counterclockwise modes. The protrusion 1210 preferentially outcouples light circulating in a single direction, and increases the efficiency of the device by converting the non-emitting modes into emitting modes. Many other shapes of the protrusion are possible, and each is easily fabricated using the photolithographic process described earlier.

Figure 27:
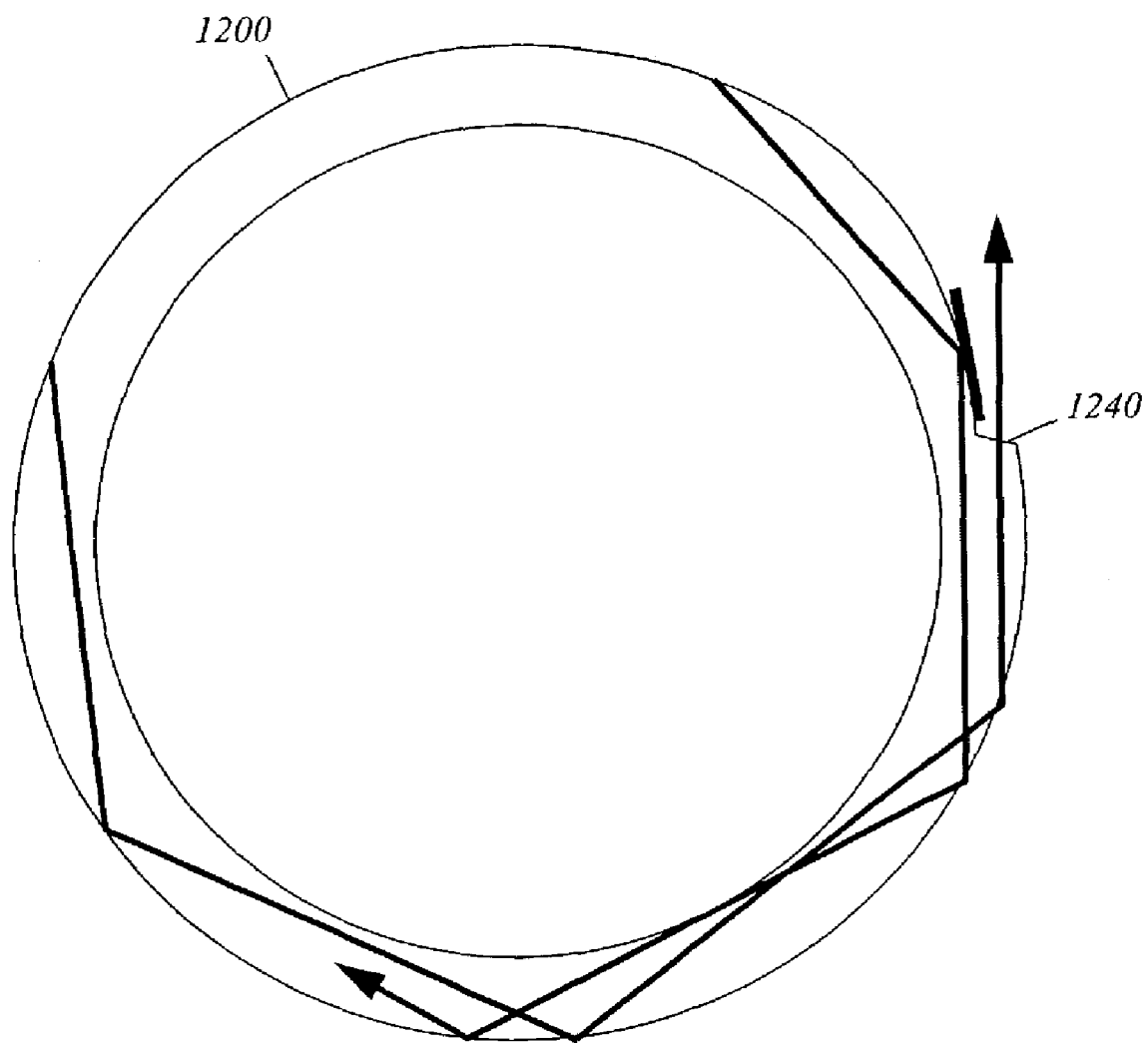
FIG. 27 shows a variation of the eighth exemplary shape embodiment of the locally-outcoupled cavity resonator, according to this invention.

Several variations on this concept may be envisioned, such as, for example, that shown in FIG. 27, where the deformity is an indentation 1240, rather than the protrusion 1210, in the circular cross-section of the disk. The indentation 1240 creates a facet, which serves as an output aperture. In various exemplary embodiments, the indentation 1240 outputs light circulating in the counterclockwise direction. The details of the shape and geometry of the output aperture 1240 can be chosen to define the qualities of the output beam and the degree of outcoupling.

Figure 28:
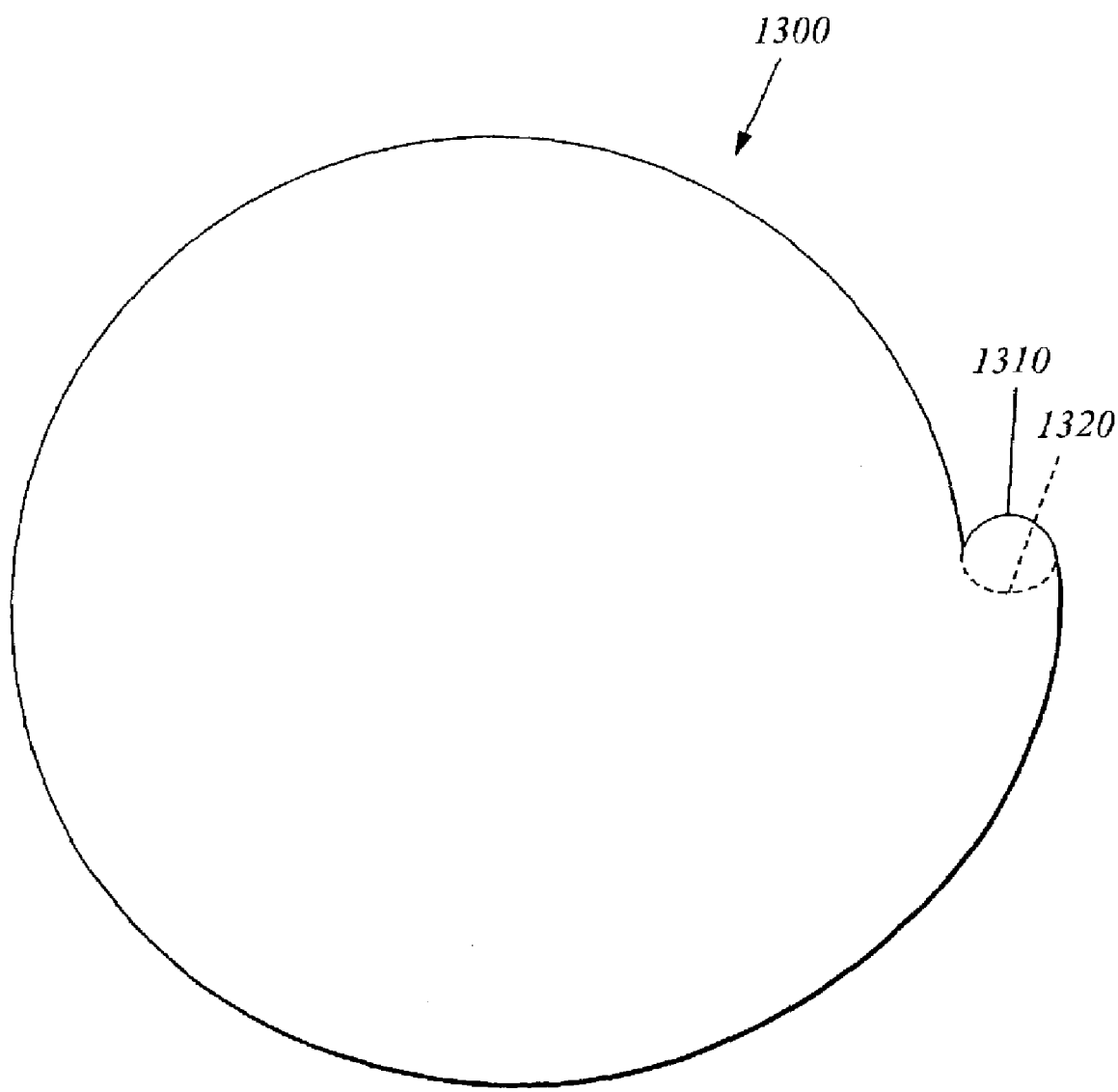
FIG. 28 shows a ninth exemplary embodiment of the shape of the locally-outcoupled cavity resonator according to this invention.

FIG. 28 shows a ninth exemplary embodiment of the locally-outcoupled cavity resonator according to this invention. This embodiment has an output aperture that is not perpendicular with respect to the tangent line to the point on the outside surface of the locally-outcoupled cavity resonator at θ=0°. Instead, the output aperture has a concave surface 1310 or a convex surface 1320. The shape of the output aperture can help define the far-field pattern. For example, the concave surface 1310 may help collimate the beam and tighten the far field divergence angle.

Figure 29:
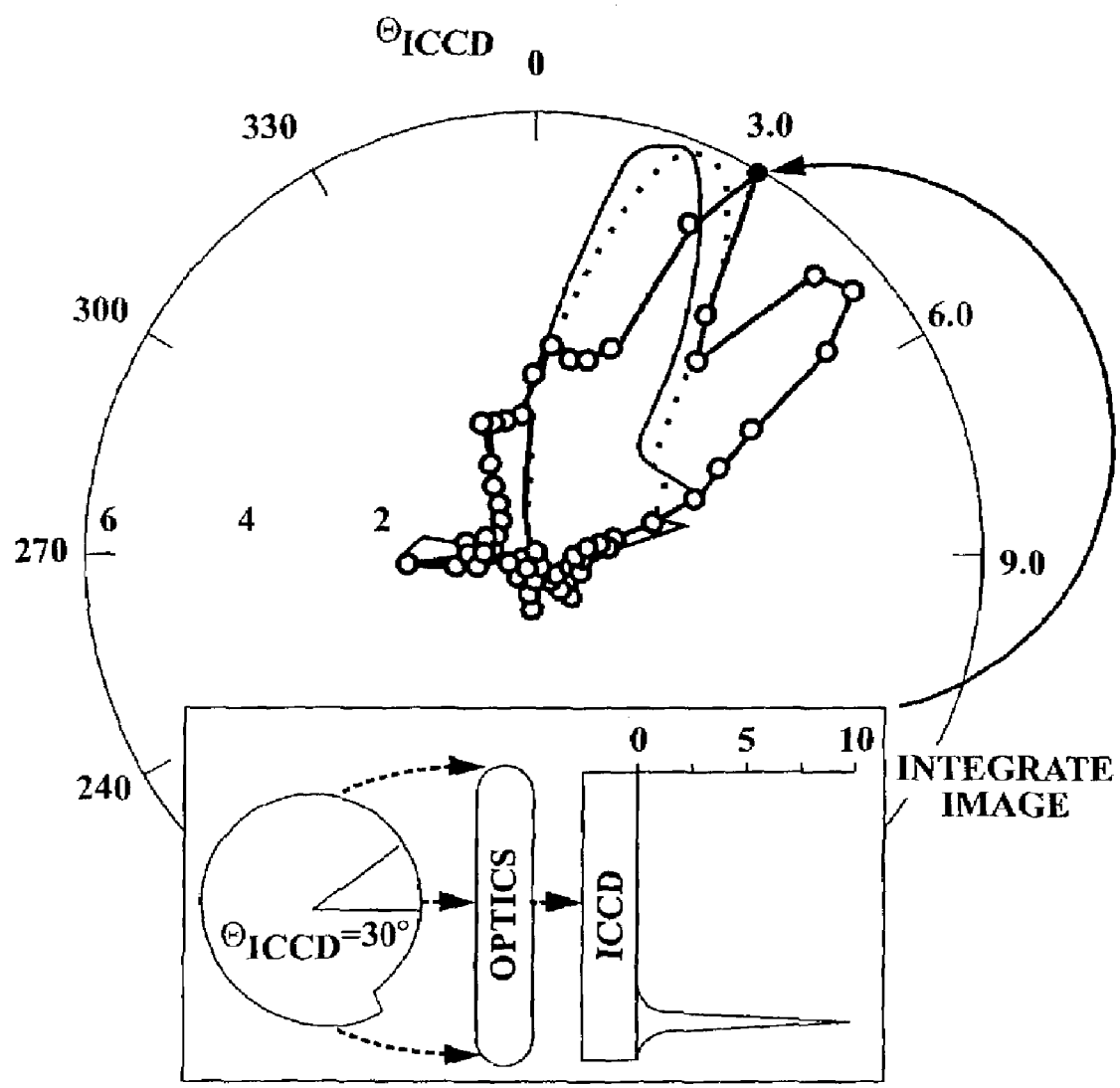
FIG. 29 shows the far field emission pattern of the locally-outcoupled cavity resonator shown in FIG. 4.

The far field emission pattern from the locally-outcoupled cavity resonator of FIG. 4 may not be a single lobe. In fact, a two-lobed emission pattern is generated by a spiral with a diameter of 500 μm, and a spiral deformation parameter of 0.10, as shown in FIG. 29. Both lobes in the emission pattern are offset from the normal direction at $\theta_{ICCD}=0°$, with the first lobe peaking at about $\theta_{ICCD}=30°$ and the other at about $\theta_{ICCD}=50°$. It is counter-intuitive that the far field emission pattern is not maximum at $\theta_{ICCD}=0°$ corresponding to normal emission from the output aperture but is instead peaked at two angles tilted from the normal as shown in FIG. 29.

Figure 30:
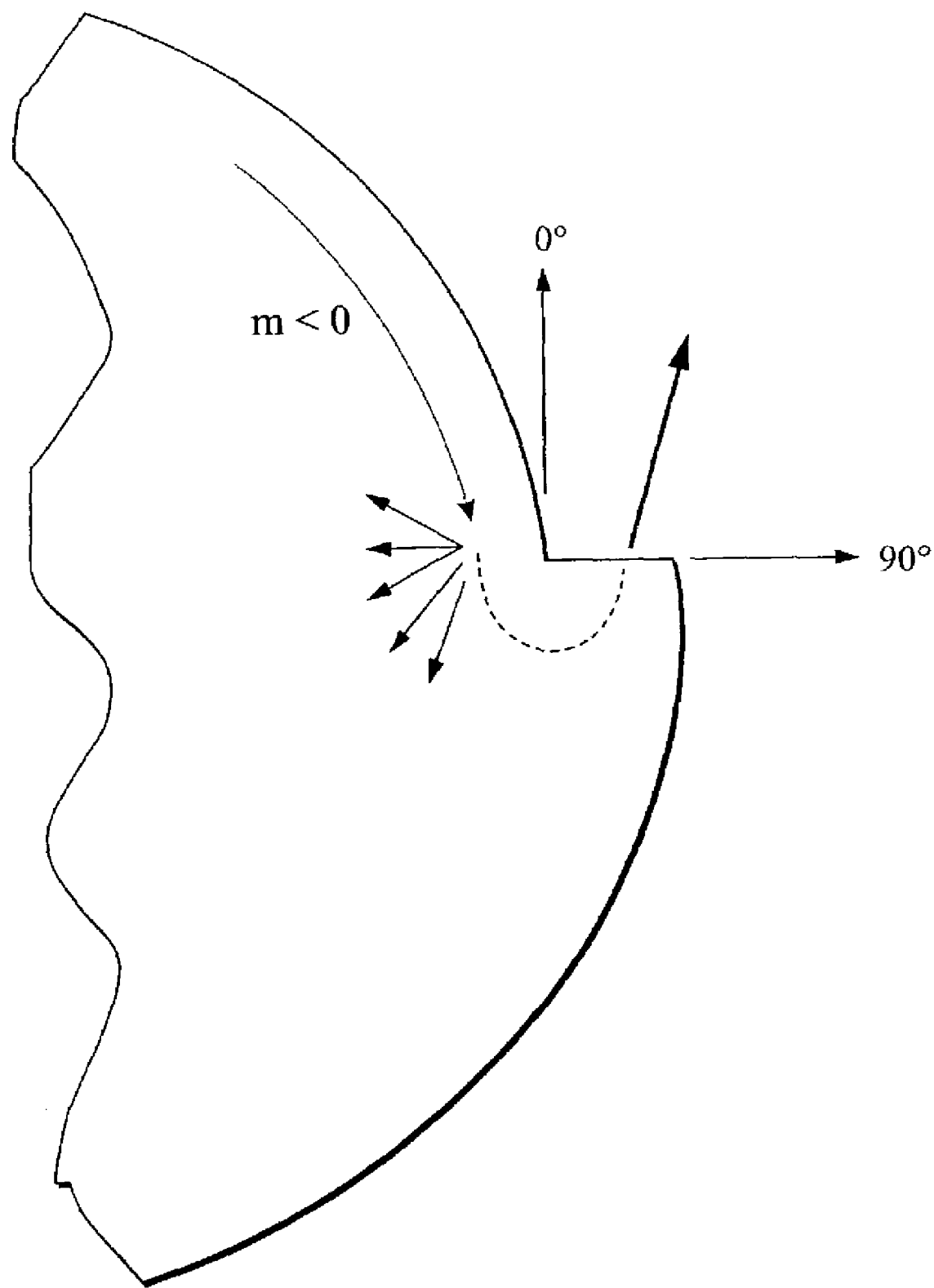
FIG. 30 depicts a mechanism that can generate the far-field pattern shown in FIG. 29.

It may be theorized that this tilt in emission angle arises because the emitting modes are actually the clockwise circulating modes, rather than the counterclockwise circulating modes. The clockwise circulating modes do not directly impinge upon the output aperture, but instead are diffracted by the inner corner of the output aperture into modes, which are then coupled out of the resonator. The output mechanism is shown schematically in FIG. 30. The clockwise component (m<0) of the resonance is incident on the output aperture interface with a spread of wave vectors determined by the specific resonance. This can be modeled by an angular decomposition of the incident field on the output aperture interface, which is assumed to include the clockwise m<0 components only and then propagating the emission into the far field.

The calculated emission lobes are the solid lines shown in FIG. 29 and are obtained from numerical solution of the Helmholtz equation. The numerical results also have a deflection from $\theta_{ICCD}=0°$ and agree fairly well with the far field emission profile. This result would appear to confirm the theory that the emitting modes are the clockwise rotating modes rather than the counterclockwise rotating modes. If this theory is indeed correct, it would have implications for the design of the amplifier chain shown in FIG. 22, in that the input beam would have to be placed appropriately (angularly offset from the normal) to couple into the correct circulating mode, and the amplified signal would then be output from the same or a different aperture.

While this invention has been described in conjunction with various exemplary embodiments, it is to be understood that many alternatives, modifications and variations would be apparent to those skilled in the art. To the extent that certain features have been explained with respect to certain beliefs and theories, it is to be understood that the invention is not bound by any particular beliefs or theories. Accordingly, the preferred embodiments of this invention, as set forth above are intended to be illustrative, and not limiting. Various changes can be made without departing from the spirit and scope of this invention.

What is claimed is:

1. A locally-outcoupled optical resonator, having a substantially smooth curved outer periphery bounded by reflective walls, in which light can circulate in at least a pair of possible directions, the curved outer periphery including at least one local perturbing feature, the perturbing feature serving to asymmetrically outcouple light circulating in a first one of the pair of possible directions within the curved outer periphery, into propagating free space modes, and the perturbing feature is an indentation in the substantially smooth curved outer periphery.

2. The locally-outcoupled optical resonator of claim 1, wherein the perturbing feature is a protrusion extending outward from the smooth curved outer periphery, wherein the protrusion provides an optical path to outcouple light circulating in the first of the pair of directions within the locally-outcoupled optical resonator.

3. The locally-outcoupled optical resonator of claim 2, wherein the protrusion has a lenticular surface.

4. The locally-outcoupled optical resonator of claim 2, wherein the protrusion has a convex shape or a concave shape.

5. The locally-outcoupled optical resonator of claim 2, wherein the protrusion has a reflective surface.

6. The locally-outcoupled optical resonator of claim 1, further comprising an electrode lying on a top surface of the locally-outcoupled optical resonator.

7. The locally-outcoupled optical resonator of claim 6, wherein the electrode is a ring centered on a center of the locally-outcoupled optical resonator.

8. The locally-outcoupled optical resonator of claim 6, wherein an outer edge of the electrode follows a perimeter of a least the locally-outcoupled optical resonator.

9. The locally-outcoupled optical resonator of claim 1, wherein the smooth curved outer periphery comprises at least one semicircular portion having smooth outer edges.

10. The locally-outcoupled optical resonator of claim 9, further comprising an electrode lying on a top surface of the at least one semicircular portion.

11. The locally-outcoupled optical resonator of claim 10, wherein the electrode has an outer edge which follows a perimeter of the at least one semicircular portion.

12. An amplifier chain comprising at least one locally-outcoupled optical resonator according to claim 9, wherein each locally-outcoupled optical resonator acts as an amplifier of a signal input to that locally-outcoupled optical resonator.

13. The amplifier chain of claim 12, wherein at least one locally-outcoupled optical resonator of the amplifier chain comprises semicircular portions having different radii of curvature.

14. The amplifier chain of claim 12, wherein the at least one locally-outcoupled optical resonator comprising semicircular portions having different radii of curvature acts to amplify at least one selected mode of a multi-mode signal input to each such locally-outcoupled optical resonator.

15. The amplifier chain of claim 12, wherein an output of one locally-outcoupled optical resonator is coupled to an input of another locally-outcoupled optical resonator by a waveguide fabricated on a surface of a substrate.

16. The locally-outcoupled optical resonator of claim 1, wherein the smooth curved outer periphery comprises two semicircular portions each having smooth outer edges.

17. The locally-outcoupled optical resonator of claim 1, wherein the locally-outcoupled optical resonator comprises a III-V nitride semiconductor heterostructure, formed on a substrate.

18. The locally-outcoupled optical resonator of claim 17, wherein the substrate comprises at least one of sapphire, silicon carbide, GaN, AlGaN, AlN, and silicon.

19. The locally-outcoupled optical resonator of claim 17, wherein the III-V nitride semiconductor heterostructure comprises at least one quantum well.

20. The locally-outcoupled optical resonator of claim 1, wherein the locally-outcoupled optical resonator comprises a heterostructure formed using at least one of GaAs, InAs, AlAs, InP, AlP, and GaP.

21. The locally-outcoupled optical resonator of claim 1, wherein the locally-outcoupled optical resonator comprises a heterostructure formed using at least one of InGaAs, AlGaAs, InAlAs, InGaAsP, InGaP, and InAlP.

22. The locally-outcoupled optical resonator of claim 1, wherein the locally-outcoupled optical resonator comprises a heterostructure formed using at least one of ZnSe, CdS, MgS, MgSe, CdSe, CdTe, ZnO, and MgO.

23. The locally-outcoupled optical resonator of claim 1, wherein the locally-outcoupled optical resonator comprises organic light-emitting polymers.

24. The locally-outcoupled optical resonator of claim 1, wherein a central portion of the locally-outcoupled optical resonator has been removed.

25. The locally-outcoupled optical resonator of claim 24, wherein a remaining portion of the locally-outcoupled optical resonator is an annulus.

26. The locally-outcoupled optical resonator of claim 1, wherein the substantially smooth curved outer periphery is formed by wet etching.

27. The locally-outcoupled optical resonator of claim 1, wherein the substantially smooth curved outer periphery is formed by dry etching.

28. The locally-outcoupled optical resonator of claim 1, wherein the substantially smooth curved outer periphery is formed by wet etching and dry etching.

29. The locally-outcoupled optical resonator of claim 1, wherein the substantially smooth curved outer periphery is formed by at least one of wet etching, dry etching, and chemically assisted ion beam etching.

30. A locally-outcoupled optical resonator, having a substantially smooth curved outer periphery bounded by reflective walls, in which light can circulate in at least a pair of possible directions, the curved outer periphery including at least one local perturbing feature, the perturbing feature serving to asymmetrically outcouple light circulating in a first one of the pair of possible directions within the curved outer periphery, into propagating free space modes, wherein the perturbing feature is a protrusion extending outward from the smooth curved outer periphery, the protrusion provides an optical path to outcouple light circulating in the first of the pair of directions within the locally-outcoupled optical resonator, the protrusion has a reflective surface, and the reflective surface reflects light incident from a second one of the pair of directions, into the first one of the pair of possible directions.

31. A locally-outcoupled optical resonator, having a substantially smooth curved outer periphery bounded by reflective walls, in which light can circulate in at least a pair of possible directions, the curved outer periphery including at least one local perturbing feature, the perturbing feature serving to asymmetrically outcouple light circulating in a first one of the pair of possible directions within the curved outer periphery, into propagating free space modes, wherein:

the substantially smooth outer periphery is a spiral shape of continuously varying radius defined by the relationship:

$$r_\theta = r_0(1+\in\theta/2\pi)$$

where:
$r_0$ is a minimum radius,
$\in$ is a spiral deformation parameter, and
$\theta$ is a rotation angle about a spiral center; and
the perturbing feature is an output aperture resulting from a discontinuity in the spiral shape, at which the outer radius of the spiral changes from a value of $r_\theta = r_0$ at $\theta = 0$ to $r_\theta = r_0(1+\in)$ at $\theta = /2\pi$.

32. The locally-outcoupled optical resonator of claim 31, wherein $\in$ has a value of about 0.05 to about 0.15.

33. The locally-outcoupled optical resonator of claim 31, further comprising a concentric ring electrode lying on or over a top surface of the spiral shape, and centered on the spiral center.

34. The locally-outcoupled optical resonator of claim 33, wherein the concentric ring electrode has a circular inner radius and a spiral-shaped outer radius.

35. The locally-outcoupled optical resonator of claim 31, further comprising an electrode lying on or over a top surface of the spiral shape and having a spiral-shaped inner radius and a spiral-shaped outer radius.

36. The locally-outcoupled optical resonator of claim 31, wherein the output aperture has a convex shape or a concave shape.

37. The locally-outcoupled optical resonator of claim 31, wherein the output aperture has a surface inclined at an angle relative to a plane of the resonator.

38. The locally-outcoupled optical resonator of claim 37, wherein the inclined surface is inclined at an angle of 45 degrees with respect to the plane of the resonator.

39. The locally-outcoupled optical resonator of claim 37, wherein the inclined surface outcouples light through a top surface of the resonator.

40. The locally-outcoupled optical resonator of claim 37, wherein the inclined surface outcouples light through a substrate supporting the resonator.

41. An amplifier chain, comprising at least one locally-outcoupled optical resonator according to claim 31 that generates an input signal for the amplifier chain, and further comprising at least one locally-outcoupled optical amplifier having a smooth curved outer periphery comprising at least one semicircular portion, which amplifies the input signal from the locally-outcoupled optical resonator.

42. The amplifier chain of claim 41, wherein an output of one locally-outcoupled optical resonator is coupled to an input of another locally-outcoupled optical amplifier by a waveguide fabricated on a surface of a substrate.

43. A locally-outcoupled optical resonator, having a substantially smooth curved outer periphery bounded by reflective walls, in which light can circulate in at least a pair of possible directions, the curved outer periphery including at least one local perturbing feature, the perturbing feature serving to asymmetrically outcouple light circulating in a first one of the pair of possible directions within the curved outer periphery, into propagating free space modes, wherein the smooth curved outer periphery comprises two semicircular portions each having smooth outer edges, and the two semicircular portions are positioned so that the at least one perturbing feature is at least one output aperture formed by at least one discontinuity between the outer edges of the two semicircular portions.

44. The locally-outcoupled optical resonator of claim 43, wherein the at least one perturbing feature is an output aperture which has a surface inclined at an angle relative to a plane of the resonator.

45. The locally-outcoupled optical resonator of claim 43, wherein the surface of the output aperture has a convex shape or a concave shape.

46. A locally-outcoupled optical resonator, having a substantially smooth curved outer periphery bounded by reflective walls, in which light can circulate in at least a pair of possible directions, the curved outer periphery including at least one local perturbing feature, the perturbing feature serving to asymmetrically outcouple light circulating in a first one of the pair of possible directions within the curved outer periphery, into propagating free space modes, wherein the smooth curved outer periphery comprises two semicircular portions each having smooth outer edges, and the two semicircular portions have two different radii.

47. The locally-outcoupled optical resonator of claim 46, wherein centers of the two semicircular portions are collocated.

48. The locally-outcoupled optical resonator of claim 46, wherein the two semicircular portions are positioned so that, at a first location where the outer edges of the semicircular portions meet, the semicircular portions are flush with one another, and, at a second location where the two semicircular portions meet, the semicircular portions form an output aperture at a discontinuity between the outer edges of the semicircular portions because of the different radii of curvature.

* * * * *